(12) United States Patent
Fujita et al.

(10) Patent No.: US 7,576,297 B2
(45) Date of Patent: Aug. 18, 2009

(54) BONDING APPARATUS AND METHOD

(75) Inventors: Kazuo Fujita, Musashimurayama (JP); Toru Maeda, Tachikawa (JP)

(73) Assignee: Kabushiki Kaisha Shinkawa, Tokyo (JP)

( * ) Notice: Subject to any disclaimer, the term of this patent is extended or adjusted under 35 U.S.C. 154(b) by 322 days.

(21) Appl. No.: 11/480,195

(22) Filed: Jun. 30, 2006

(65) Prior Publication Data
US 2007/0000878 A1    Jan. 4, 2007

(30) Foreign Application Priority Data
Jun. 30, 2005   (JP)   .............................. 2005-192427

(51) Int. Cl.
*B23K 10/00* (2006.01)
(52) U.S. Cl. ............................ 219/121.36; 219/121.48; 219/121.59
(58) Field of Classification Search ............ 219/121.52, 219/121.48, 121.59, 121.63, 121.67, 121.46
See application file for complete search history.

(56) References Cited

U.S. PATENT DOCUMENTS

| | | | |
|---|---|---|---|
| 3,738,560 A * | 6/1973 | Kulicke et al. ................ 228/10 |
| 5,380,978 A * | 1/1995 | Pryor ..................... 219/121.64 |
| 6,429,400 B1 | 8/2002 | Sawada et al. | |
| 2005/0015980 A1 * | 1/2005 | Kottilingam et al. ... 29/888.011 |
| 2005/0268517 A1 * | 12/2005 | Withers et al. ............. 42/76.02 |

FOREIGN PATENT DOCUMENTS

| JP | 11-260597 | 9/1999 |
|---|---|---|
| JP | 2000-340599 | 12/2000 |
| JP | 2001-015549 | 1/2001 |
| JP | 2003-328138 | 11/2003 |

* cited by examiner

*Primary Examiner*—Mark H Paschall
(74) *Attorney, Agent, or Firm*—William L. Androlia; H. Henry Koda

(57) ABSTRACT

A bonding apparatus including a capillary 40 having a high-frequency coil 50 on its tip end portion and allowing a bonding wire 2 to pass therethrough, a position changing unit for changing the position of the tip of the bonding wire, a gas supply unit for supplying gas into the capillary, and a high-frequency power supply unit for supplying high-frequency power to the high-frequency coil. When the bonding wire is outside a plasma region 52 in the capillary, a microplasma generated in the plasma region is ejected out of the capillary and removes foreign matter or contaminants on the surface of a bonding subject. When the bonding wire is inside the plasma region, the material of the bonding wire is turned into fine particles, and a microplasma 303 containing sputtered fine particles is ejected from the capillary, allowing the material the same as the bonding wire to be deposited on the bonding subject.

12 Claims, 13 Drawing Sheets

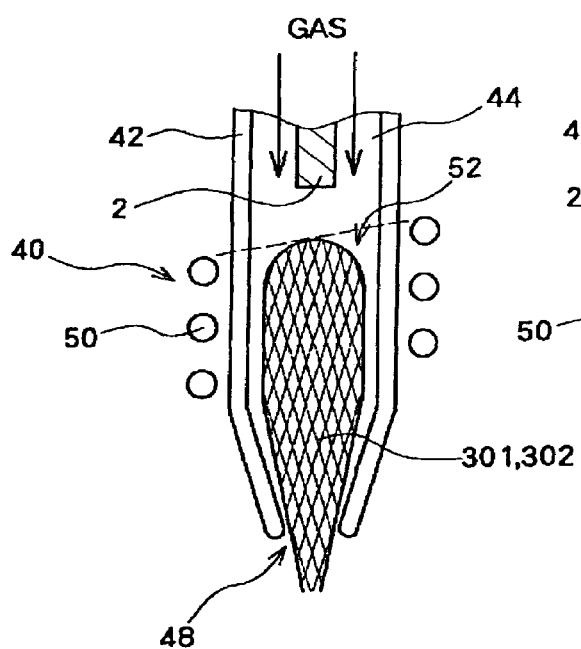
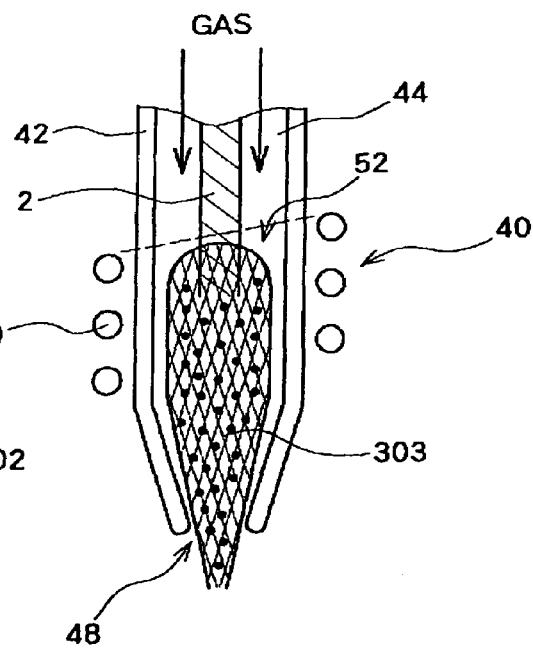
FIG. 5(a)
FIG. 5(b)

BONDING APPARATUS AND METHOD

BACKGROUND OF THE INVENTION

The present invention relates to a bonding apparatus and method and more particularly to a bonding apparatus and method for executing a bonding process after performing a surface treatment on a bonding subject Bonding apparatuses are generally for making connections between chip electrode units and circuit board lead terminals with fine metal wires. Chip electrode units connected by fine metal wires are sometimes called bonding pads, and circuit board lead terminals are sometimes called bonding leads. When fine metal wires are connected to these using ultrasonic connection technology or thermo-compression bonding or the like, it is important to know surface conditions thereof. More specifically, when the surface of either the metal layer of a bonding pad or the metal layer of a bonding lead is contaminated, or foreign matter is present thereon, it is not possible to obtain a good electrical junction between such surface and the fine metal wire, and the strength of the mechanical junction is also weak.

For that reason, one thing that is proposed is that the metal layer be protected beforehand. In Japanese Patent Application Laid-Open Disclosure (2000) No. 2001-15549, for example, a semiconductor device is disclosed, and effecting a multi-layer structure in a bonding wire connection electrode pad in a semiconductor device in which wiring materials of copper or a copper alloy are used is discussed. More specifically, a concavity is formed on a semiconductor substrate, and, in that concavity, from the lower layer, a copper film 16, a diffusion preventing film 17, and an oxidation preventing film 18 are formed, in that order. Furthermore, a copper-based anchor layer 13, 15 that contacts the lower surface of the copper film is imbedded in the insulating film layer 12 of the semiconductor device. The diffusion prevention layer is either TiN or W or the like, while the oxidation preventing film is an alloy the main component thereof is Al, Au, or Ag, or the like. All of these are formed in the concavity, and the diffusion preventing film and oxidation preventing film deposited on portions other than that are removed by chemical-mechanical polishing (CMP); as a result, an electrode pad of the same height as the insulating film is obtained.

Another thing that is tried is to subject the bonding pad or bonding lead to a surface treatment prior to performing the bonding processing. In Japanese Patent Application Laid-Open Disclosure (2000) No. 2000-340599, for example, an apparatus, among others, for effecting wire bonding after cleaning the surface to be connected are disclosed, and a wire bonding apparatus 12 integrally comprised of a plasma jet unit 50 and a wire bonding unit 51 is described therein. The plasma jet unit has a concentric double structure comprising an outer dielectric tube 23 and an inner dielectric tube 22. A grounded conical electrode 27 is provided in the outer dielectric tube, and a rod-shaped high-frequency electrode 26 is provided in the interior of the inner dielectric tube, respectively, and, therebetween, after introducing, for example, argon gas an intra-atmospheric glow discharge is induced, and a low-temperature plasma is generated. The plasma generated in this manner is ejected from a gas ejection port, exposed on an electrode on a BGA board, contamination thereupon is removed, and, thereafter, wire bonding is performed.

Japanese Patent Application Laid-Open Disclosure (1999) No. H11-260597, which is corresponding to U.S. Pat. No. 6,429,400 B1 discloses a plasma processing apparatus, among others, are disclosed, and the cooling of electrodes 3 and the outer electrode 1 and the like are described therein as a method of suppressing streamer discharges in order to perform a plasma process by a stabilized glow discharge. A system using this plasma processing apparatus, as described therein, performs surface treatments on a plurality of bonding pads enclosing electronic components on IC-mounted circuit boards transported by a belt conveyor. It is further described that the coordinates of the bonding pads of the boards are read in, the jetting position of a plasma jet is controlled according to those coordinates, and, by sequential feeding, only the bonding pads are subjected to plasma processing.

In Japanese Patent Application Laid-Open Disclosure (2003) No. 2003-328138, a microplasma CVD apparatus is disclosed. In this apparatus, a high-frequency coil 7 is provided at the narrowed tip of a tubular plasma torch 5 formed of an insulating material 3, and a wire passes through the inside of the plasma torch; and in this structure, induction plasma is induced by high-frequency electric power between the high-frequency coil and the wire inside the plasma torch. It is farther described that the diameter at the tip of the plasma torch is about 100 μm, and, thereby, in a 200 μm or so area, materials such as graphite and glassy carbon are deposited in the atmosphere using a high-density microplasma.

Of the conventional technologies in which bonding pads or bonding leads are subjected to a surface treatment prior to bonding processing, the technologies treated in Japanese Patent Application Laid-Open Disclosure (2000) Nos. 2000-340599 and H11-260597 employ gas that is being a plasma by a glow discharge. This method is a capacitively coupled plasma generating method, and it involves electrical discharges; accordingly, there would be damage to electronic devices. As a result, there are limitations in applying this method to objects that are thereafter very difficult to anneal, as with bonding processing.

The technology of Japanese Patent Application Laid-Open Disclosure (2003) No. 2003-328138, furthermore, uses an induction plasma induced by a high-frequency coil and hence belongs to the so-called inductively coupled plasma generation methods. Inductively coupled plasma, in general, is a hot plasma, and, with the high plasma temperature as is, electronic devices are damaged. The microplasma technology of Japanese Patent Application Laid-Open Disclosure (2003) No. 2003-328138 discloses stably generating this hot plasma in an extremely narrow space; and in this technology, small, limited areas are irradiated with plasma, and little thermal damage wilt be done. From these facts, it is considered possible to use the microplasma technology of Japanese Patent Application Laid-Open Disclosure (2003) No. 2003-328138 in surface treatment prior to bonding processing.

For wire bonding apparatuses, meanwhile, the current demands for higher precision and higher speed are strong, and, in the movement of bonding heads for holding wires and performing bonding processes, high-precision positioning is performed at high speed, Accordingly, in order to perform surface treatment prior to bonding processing, the unique demands of such a bonding apparatus made to operate at high speed must be taken into consideration. Japanese Patent Application Laid-Open Disclosure No. H11-260597 and No. 2003-328138 do not give consideration to the relationship with bonding processing, and, in Japanese Patent Application Laid-Open Disclosure (2000) No. 2000-340599, no specific content for an integrated configuration for a plasma jet unit and a wire bonding unit is discussed.

As seen from the above, with bonding apparatuses in the conventional art, it is very difficult to efficiently perform surface treatment and bonding processing on bonding subjects. Bonding subject surface treatments can be largely divided between removal processes and deposition processes. In surface removal processes, foreign matter such as an oxidized film and organic matter or the like on the surface of bonding subjects is removed by oxidation, reduction, or etching or the like, making surface of the boding subjects clean. In deposition processes, a material exhibiting good bonding qualities, such as gold that is the same as the bonding wire, for example, is deposited on the surface of the bonding subject Material removal and deposition are possible with conventional microplasma technology described above, but what is yet to be resolved is how to employ that in bonding technology.

BRIEF SUMMARY OF THE INVENTION

Accordingly, it is an object of the present invention to provide a bonding apparatus and method capable of efficiently performing surface treatments and bonding processing on bonding subjects on which bonding is executed.

It is another object of the present invention to provide a bonding apparatus and method that makes it possible to effect surface treatments on bonding subjects using microplasma.

It is stilt another object of the present invention to provide a bonding apparatus and method that makes it possible to deposit a suitable material, after removing foreign matter or contaminants such as an oxidized film and organic matter or the like on the surface of a bonding subject, by microplasma. (Hereinafter abbreviate "foreign matter or contaminants such as an oxidized film and organic matter or the like" to "foreign matter or contaminants".)

The above objects are accomplished by a unique structure of the present invention for a bonding apparatus comprising:
  a bonding processor for executing a bonding process on a bonding subject using a bonding tool;
  a plasma capillary having a high-frequency coil wound on a tip end portion thereof;
  an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject;
  a position changing unit for changing positions a tip of a thin wire being made of a prescribed material inserted the interior of the plasma capillary between a surface removal position being outside of a plasma region and a surface deposition position being inside of the plasma region in the interior of the plasma capillary; and
  a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit.

The above objects are accomplished by another unique structure of the present invention for a bonding apparatus comprising:
  a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof;
  a gas supply unit for supplying gas to an interior of the capillary;
  a position changing unit for changing positions of a tip position of the bonding wire; and
  a controller for controlling a wire bonding processing.

The above objects are accomplished by still another unique structure of the present invention for a bonding apparatus comprising:
  a bonding processor for executing a bonding process on a bonding subject using a bonding arm having a bonding capillary;
  a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject;
  a plasma processor for performing the surface treatment on the bonding subject using a plasma arm having the plasma capillary at a tip end thereof;
  a position changing unit for changing positions a tip of a thin wire being made of a prescribed material inserted the interior of the plasma capillary between a surface removal position being outside of a plasma region and a surface deposition position being inside of the plasma region in the interior of the plasma capillary; and
  a controller for interconnectedly controlling actions of the bonding arm and actions of the plasma arm.

The above objects are accomplished by an unique set of steps of the present invention for a bonding apparatus, comprising:
  providing a bonding apparatus, the bonding apparatus comprising:
    a bonding processor for executing a bonding process on a bonding subject using a bonding tool,
    a plasma capillary having a high-frequency coil wound on a tip end portion thereof,
    an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject,
    a position changing unit for changing positions of a tip position of thin wire being made of a prescribed material inserted the interior of the plasma capillary between a surface removal position being outside of a plasma region and a surface deposition position being inside of the plasma region in the interior of the plasma capillary, and
    a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit;
  changing positions of the tip of the thin wire inserted the interior of the plasma capillary between
    a surface removal position where the tip of the thin wire being positioned outside the plasma region, and a surface deposition position where the tip of the thin wire being positioned inside the plasma region;

depositing the prescribed material on the bonding subject to move positions of the tip of the thin wire to the surface deposition position in the interior of the plasma capillary by controlling the position changing unit after removing foreign matter or contaminants of a surface on the bonding subject to move positions of the tip of the thin wire to the surface removal position in the interior of the plasma capillary by controlling the position changing unit; then executing the bonding process onto a site depositing the prescribed material by the bonding processor.

The above objects are accomplished by another unique set of steps of the present invention for a bonding apparatus, comprising:

providing a bonding apparatus, the bonding apparatus comprising:

a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof, a gas supply unit for supplying gas to an interior of the capillary, a position changing unit for changing positions of a tip position of the bonding wire, and a controller for controlling a wire bonding processing;

changing positions of the tip position of the bonding wire inserted into the capillary among a bonding process position for effecting wire bonding, a surface removal position where the tip of the bonding wire being positioned outside the plasma region, and a surface deposition position where the tip of the bonding wire being positioned inside the plasma region;

depositing the material of the bonding wire on the bonding subject to move positions of the tip of the bonding wire to the surface deposition position in the interior of the capillary by controlling the position changing unit after removing foreign matter or contaminants of a surface on the bonding subject to move positions of the tip of the bonding wire to the surface removal position in the interior of the capillary by controlling the position changing unit; then executing the bonding process onto a site depositing the material of the bonding wire.

The above objects are accomplished by still another unique set of steps of the present invention for a bonding apparatus, comprising:

providing a bonding apparatus, the bonding apparatus comprising:

a bonding processor for executing a bonding process on a bonding subject using a bonding arm having a bonding capillary, a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject, a plasma processor for performing the surface treatment on the bonding subject using a plasma arm having the plasma capillary at a tip end thereof, a position changing unit for changing positions a tip of a thin wire being made of a prescribed material inserted the interior of the plasma capillary between a surface removal position being outside of a plasma region and a surface deposition position being inside of the plasma region in the interior of the plasma capillary, and a controller for interconnectedly controlling actions of the bonding arm and actions of the plasma arm;

changing positions of the tip of the thin wire inserted the interior of the plasma capillary between a surface removal position where the tip of the thin wire being positioned outside the plasma region, and a surface deposition position where the tip of the thin wire being positioned inside the plasma region; and depositing the prescribed material on the bonding subject to move positions of the tip of the thin wire to the surface deposition position in the interior of the plasma capillary by controlling the position changing unit after removing foreign matter or contaminants of a surface on the bonding subject to move positions of the tip of the thin wire to the surface removal position in the interior of the plasma capillary by controlling the position changing unit; then executing the bonding process onto a site depositing the prescribed material by the bonding processor.

The above objects are accomplished by still another unique set of steps of the present invention for a bonding apparatus, comprising:

providing a bonding processor for executing a bonding process on a bonding subject using a bonding tool;

providing a plasma capillary having a high-frequency coil wound on a tip end portion thereof;

providing an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject;

providing a position changing unit for changing positions of a tip of a thin wire being made of a prescribed material inserted the interior of the plasma capillary between a surface removal position being outside of a plasma region and a surface deposition position being inside of the plasma region in the interior of the plasma capillary;

providing a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit;

changing positions of the tip of the thin wire inserted the interior of the plasma capillary between a surface removal position where the tip of the thin wire being positioned outside the plasma region, and a surface deposition position where the tip of the thin wire being positioned inside the plasma region;

depositing the prescribed material on the bonding subject to move positions of the tip of the thin wire to the surface deposition position in tile interior of the plasma capillary by controlling the position changing unit after removing foreign matter or contaminants of a surface on the bonding subject to move positions of the tip of the thin wire to the surface removal position in the interior of the plasma capillary by controlling the position changing unit; than executing the bonding process onto a site depositing the prescribed material by the bonding processor.

The above objects are accomplished by still another unique set of steps of the present invention for a bonding apparatus, comprising:

providing a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof;

providing a gas supply unit for supplying gas to an interior of the capillary;

providing a position changing unit for changing positions of a tip position of the bonding wire;

providing a controller for controlling a wire bonding processing;

changing positions of the tip position of the bonding wire inserted into the capillary among
a bonding process position for effecting wire bonding,
a surface removal position where the tip of the bonding wire being positioned outside the plasma region, and
a surface deposition position where the tip of the bonding wire being positioned inside the plasma region;

depositing the material of the bonding wire on the bonding subject to move positions of the tip of the bonding wire to the surface deposition position in the interior of the capillary by controlling the position changing unit after removing foreign matter or contaminants of a surface on the bonding subject to move positions of the tip of the bonding wire to the surface removal position in the interior of the capillary by controlling the position changing unit; then executing the bonding process onto a site depositing the material of the bonding wire.

The above objects are accomplished by still another unique set of steps of the present invention for a bonding apparatus, comprising:

providing a bonding processor for executing a bonding process on a bonding subject using a bonding arm having a bonding capillary;

providing a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject;

providing a plasma processor for performing the surface treatment on the bonding subject using a plasma arm having the plasma capillary at a tip end thereof;

providing a position changing unit for changing positions a tip of a thin wire being made of a prescribed material inserted the interior of the plasma capillary between a surface removal position being outside of a plasma region and a surface deposition position being inside of the plasma region in the interior of the plasma capillary;

providing a controller for interconnectedly controlling actions of the bonding arm and actions of the plasma arm;

changing positions of the tip of the thin wire inserted the interior of the plasma capillary between
a surface removal position where the tip of the thin wire being positioned outside the plasma region, and
a surface deposition position where the tip of the thin wire being positioned inside the plasma region;

depositing the prescribed material on the bonding subject to move positions of the tip of the thin wire to the surface deposition position in the interior of the plasma capillary by controlling the position changing unit after removing foreign matter or contaminants of a surface on the bonding subject to move positions of the tip of the thin wire to the surface removal position in the interior of the plasma capillary by controlling the position changing unit; then executing the bonding process onto a site depositing the prescribed material by the bonding processor.

In at least one of the configurations of the present invention described above, in addition to a bonding processor, an inductively coupled microplasma generator is provided that includes a plasma capillary having a high-frequency coil wound on a tip end portion thereof, and this inductively coupled microplasma generator ejects gas being a plasma in an interior of the plasma capillary by supply of electric power to the high-frequency coil, from an opening at a tip end of the plasma capillary onto the bonding subject, thus performing a surface treatment on the bonding subject Furthermore, a thin wire made of a prescribed material is inserted into the plasma capillary, and the position of the tip thereof is changed between two positions, one outside the plasma region, and one inside the plasma region. As a result, when the thin wire is outside the plasma region, the gas being a plasma not comprising the thin wire material is ejected onto the bonding subject and foreign matter or contaminants on the surface of the bonding subject are removed; and when the thin wire is inside the plasma region, the thin wire material is also ejected onto and deposited on the bonding subject, together with the gas being a plasma.

In this way, in the present invention, the surface treatment to the bonding subject can be done, performing the surface removal processing (hereinafter, define "surface removal processing" as "removing foreign matter or contaminants such as an oxidized film and organic matter or the like on the surface of bonding subjects") and surface deposition processing continuously (hereinafter, define "surface deposition processing" as "depositing a suitable material on the bonding subjects"), and furthermore, bonding subjects subjected to this surface treatment can, following thereupon, be subjected to bonding processing. Accordingly, with one bonding apparatus, functions for irradiating a small area on a bonding subject with a microplasma and performing surface removal processing and surface deposition processing with little heat damage, and bonding processing functions, can be comprised, making it possible to efficiently perform surface treatment and bonding processing on bonding subjects.

Furthermore, in at least one of the configurations of the present invention described above, a capillary having a high-frequency coil which is wound about the outer circumference of its tip end portion and to which high-frequency electric power is supplied, with a bonding wire passing through the interior thereof; a gas supply unit for supplying gas to the interior of the capillary, and a position changing unit for changing the position of the tip of the bonding wire, are provided. The position changing unit changes the position of the tip of the bonding wire inserted into the capillary between three positions, namely a bonding process position for effecting wire bonding, a position outside the plasma region in the interior of the capillary, and a position inside the plasma region. As a result, when the thin wire is outside the plasma region, the gas being a plasma not comprising the thin wire material can be ejected onto the bonding subject and foreign matter or contaminants on the surface thereof removed; when the thin wire is inside the plasma region, the thin wire material can also be ejected onto and deposited on the bonding subject, together with the gas being a plasma; and, when it is at the bonding process position, wire bonding can be performed.

As seen from the above, using one capillary, the surface treatment to the bonding subject can be done, performing the surface removal processing and surface deposition processing continuously; and further, bonding subjects subjected to this surface treatment can, following thereupon, be subjected to bonding processing. Thus, it is possible to more efficiently perform surface treatment and bonding processing on bonding subjects.

Furthermore, with at least one of the configurations described above, the action of a bonding arm having a bonding capillary, and the action of a plasma arm that has at the tip end thereof a plasma capillary capable of performing surface removal processing and surface deposition processing on the surface of a bonding subject, are interconnectedly controlled. Accordingly, it is possible to perform efficient surface treatment in a relationship with bonding processing. By interconnectedly is meant that, instead of batch processing, actions are done simultaneously, in parallel, and it includes actions done synchronously or actions done, if not synchronously, sequentially at substantially the same time, etc.

Furthermore, for the bonding subjects of the same type and for the same sites thereon, for instance, the bonding pads, the bonding head performs bonding processing at a bonding stage, while the microplasma generator performs surface treatments at a surface treatment stage. Accordingly, it is possible to perform bonding processing and surface treatments simultaneously, in parallel. Bonding processing and surface treatments can be performed by, for example, similar sequencing software.

Furthermore, because bonding processing and surface treatments for the same bonding subject are interconnectedly performed, surface treatment and bonding processing are performed simultaneously, in parallel, or sequentially, on, for example, one chip, thus making it possible to perform bonding processing immediately after surface treatment.

Furthermore, because the bonding arm and the plasma arm are moved as one unit, the movement mechanism is simplified.

As seen from the above, according to the bonding apparatus of the present invention, it is possible to perform surface treatment and bonding processing on bonding subjects efficiently. Furthermore, surface treatments on bonding subjects with microplasma is possible in the present invention; and it is also possible to effect surface treatment in which a suitable material is deposited, after removing foreign matter or contaminants on the surface of a bonding subject, by microplasma.

BRIEF DESCRIPTION OF THE SEVERAL VIEWS OF THE DRAWINGS

FIG. 5(a) shows microplasma generation in surface removal processing, and FIG. 5(b) shows microplasma generation in surface deposition processing, according to an embodiment of the present invention;

DETAILED DESCRIPTION OF THE INVENTION

The present invention will be described below in detail with reference to the accompanying drawings.

In the following, detailed description is given concerning ordinary wire bonding, in particular, for surface treatment and bonding processing related to chip bonding pads and board bonding leads.

Ordinary wire bonding here refers to performing a first wire bonding to a bonding pad on a chip mounted on a substrate, then extending the wire and performing a second bonding on the bonding lead.

For connection technology related to bonding pads and bonding leads, in addition to wire bonding technology, depending on the properties of the bonding subjects, wire bonding on stacked devices laminated on chips, technology for forming flip chips, chip on film (COF) technology, ball grid array (BGA) technology, and the like are used. In the below description, as many embodiments as possible will be described in addition to ordinary wire bonding technology, but the present invention is applicable to other surface treatments and bonding processing related to bonding pads and bonding leads.

As described above, by bonding processing is here meant connection processing related to chip bonding pads and board bonding leads, in the wider sense, not simply limited to wire bonding—Accordingly, while the bonding tool used in bonding processing is a capillary that allows a wire to pass therethrough, in the case of wire bonding, that may not always be a capillary in other technologies. In the case of COF, for example, a collet for grasping and bonding the chip becomes the bonding tool.

In the following description, surface treatment is described basically as applied to both bonding pads and bonding leads, but one or other may be omitted, depending on the properties of the specific bonding subject.

Furthermore, surface treatment can be divided largely into surface removal processing and surface deposition processing; and in terms of removal processing, there are oxidation, reduction, and etching and the like. In the description below, the capillary used in surface treatment is assumed to be a single one, and the surface removal processing is performed by switching the gas supply source; however, in order to eliminate gas switching delay, a plurality of capillaries used in surface treatment can also be mounted and used, respectively, for different surface treatments.

EMBODIMENT 1

Figure 1:
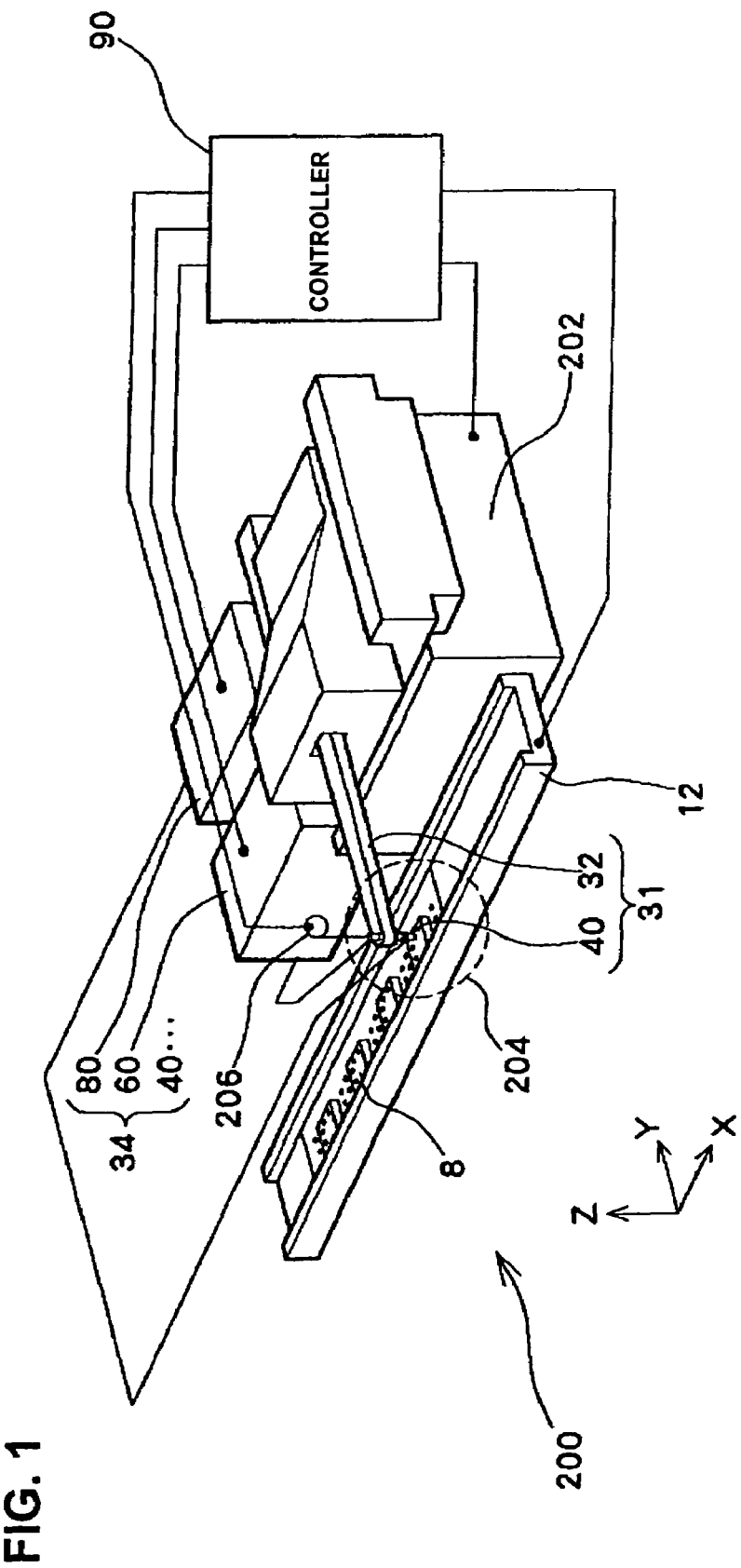
FIG. 1 shows a wire bonding apparatus in accordance with an embodiment the present invention.

FIG. 1 shows a wire bonding apparatus 200 capable of performing surface treatments and bonding processing.

Chips mounted on a substrate are also shown as bonding subjects 8, The wire bonding apparatus 200 has functions for performing a surface treatment, by the action of the plasma-state gas prior to the bonding processing, on a narrow area for performing bonding, specifically on a chip bonding pad and board bonding leads, for a bonding subject 8, and then performing bonding processing.

More specifically, for the surface treatment on bonding pads and bonding leads, foreign matter such as an oxidized film and organic matter or the like on the surface thereof are subjected to removal processing, after which processing is done to deposit a material that is the same as the bonding wire. The apparatus 200 further performs a process for connecting bonding wires to the bonding pads and bonding leads on which surface removal processing and/or surface deposition processing have been performed. A thin wire of gold or aluminum or the like can be used as the bonding wire.

The wire bonding apparatus 200 is comprised of a transporter mechanism 12 for holding the bonding subject 8 and transporting it to a prescribed position on a bonding stage 204, an arm 31 having a capillary 40 fitted to the tip end of its arm main body 32, an XYZ drive mechanism 202 for movement-driving the arm 31, a position changing unit 206 for changing the position of the bonding wire passing through the capillary 40, a surface treatment gas supply unit 60, a surface treatment high-frequency power supply unit 80, and a controller 90 for integrally controlling the elements. The capillary 40, gas supply unit 60, and high-frequency power supply unit 80 form a microplasma generator 34.

The XYZ drive mechanism 202 has functions capable of moving the arm 31 to any desired position in the X axis direction and Y axis direction as shown in FIG. 1, and it also drives the tip end of the capillary 40 up and down in the Z axis direction at that desired position. The arm 31 is comprised of an arm main body 32 and the capillary 40 fitted to the tip end thereof. The XYZ drive mechanism 202 is comprised of a high-speed XY table for carrying the arm main body 32 and a high-speed Z motor for swing-driving the arm main body 32 and moving the capillary 40 fitted to the tip end thereof up and down. For positioning, a servo mechanism using sensors is used.

Figure 2:
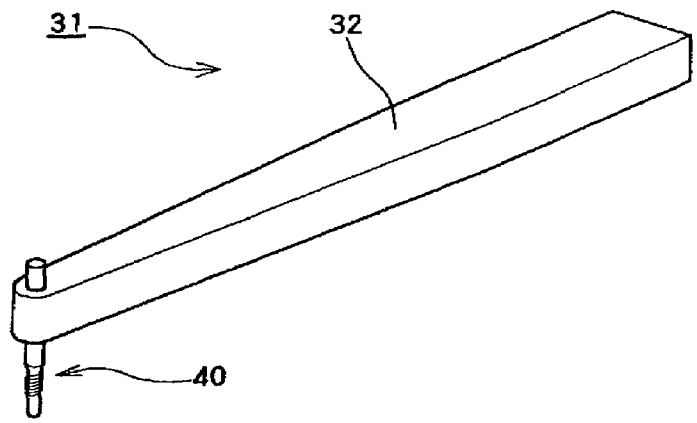
FIG. 2 shows an arm having a capillary at a tip end thereof for surface treatment and bonding processing according to an embodiment of the present invention.

The arm 31 is comprised of the arm main body 32 and the capillary 40 fitted to the tip end thereof, as described above, and it also has functions for supplying ultrasonic energy to the capillary 40 by an ultrasonic transducer (not shown in the drawings) and pressing the bonding wire that passes through the capillary 40 against the bonding subject 8. FIG. 2 shows the arm 31 by itself. The capillary 40, as is commonly known, is a narrow tubular member through which a bonding wire passes but is also a constituting element in the microplasma generator 34 and is therefore different in a number of particulars from an ordinary capillary usually used in wire bonding. Those differences will be described subsequently.

Before describing the particulars of the microplasma generation functions of the capillary 40 related to surface treatment the position changing unit 206, the gas supply unit 60, and the high-frequency power supply unit 80, the remaining elements will be first described.

The transporter mechanism 12 has functions for transporting the bonding subject 8 to a bonding stage 204 that is the process area for the plasma capillary 40 and fixing the positioning there, causing the bonding subject 8 to be subjected to surface treatment, and, following thereupon, causing the bonding subject 8 to be subjected to bonding processing. For such a transporter mechanism 12, a mechanism for clamping and moving the object being transported, or the like, can be used.

The controller 90 is an electronic circuit unit and is connected to the transporter mechanism 12, the bonding XYZ drive mechanism 202, the position changing unit 206, the gas supply unit 60, and the high-frequency power supply unit 80, and the like. The controller 90 functions to control those elements so that surface treatment is performed on the bonding subject 8 and then bonding processing is performed. Those functions are executed by software. More specifically, such functions are done by executing a wire bonding program that embodies routines for interconnectedly performing surface treatment and bonding processing. Some of those functions can be effected with hardware.

Figure 3:
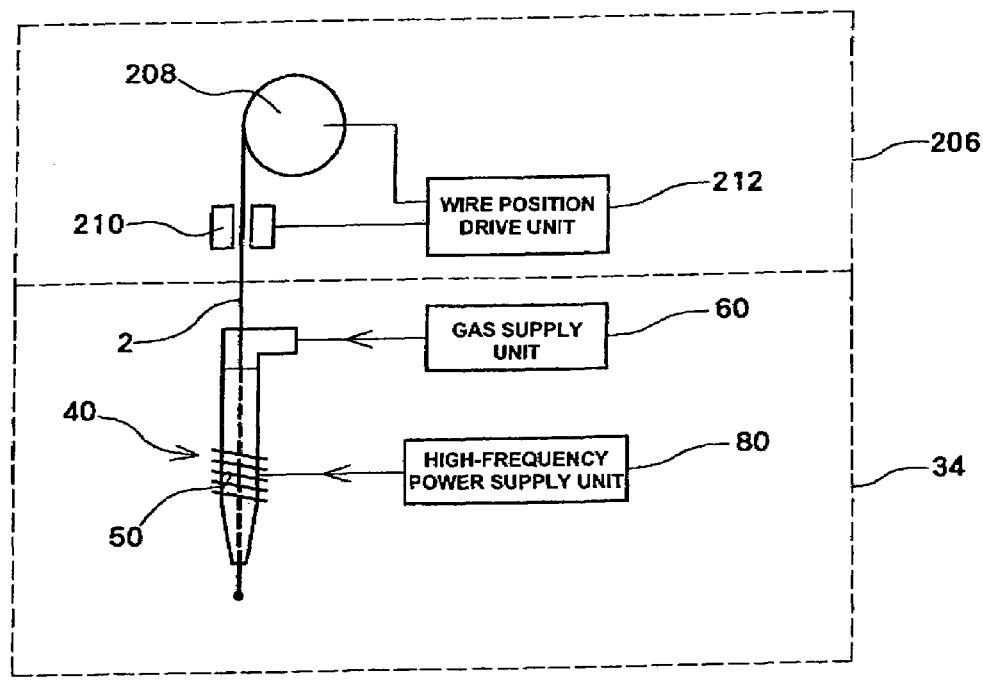
FIG. 3 shows the constituting elements for the surface treatment according to an embodiment of the present invention.

FIG. 3 shows the elements related to surface treatment. The elements related to surface treatment are largely divided between the microplasma generator 34 and the position changing unit 206. The microplasma generator 34 is for generating plasma in the interior of the capillary 40 and causing that to be ejected from the tip end of the capillary 40, and the position changing unit 206 is for changing the relationship between the plasma region where the microplasma is generated and the position where the tip of the bonding wire 2 is located, The position changing unit 206 is comprised of, among others, a spool 208 for supplying the bonding wire 2, a clamper 210 for clamping and releasing the wire 2 to control the movement of the bonding wire 2, and a wire position drive unit 212 for turning the spool 208 and opening and closing the clamper 210. Command of the action of the wire position drive unit 212 is effected under the control of the controller 90. As a result, the forward and reverse turning direction of the spool 208, the turning amount of the spool 208, and the timing of the opening and closing of the clamper 210 and the like are controlled, so that the position of the tip of the bonding wire 2 is changed (raised and lowered) inside of the capillary 40.

Next, the detail of the microplasma generator 34 will be described.

Figure 4:
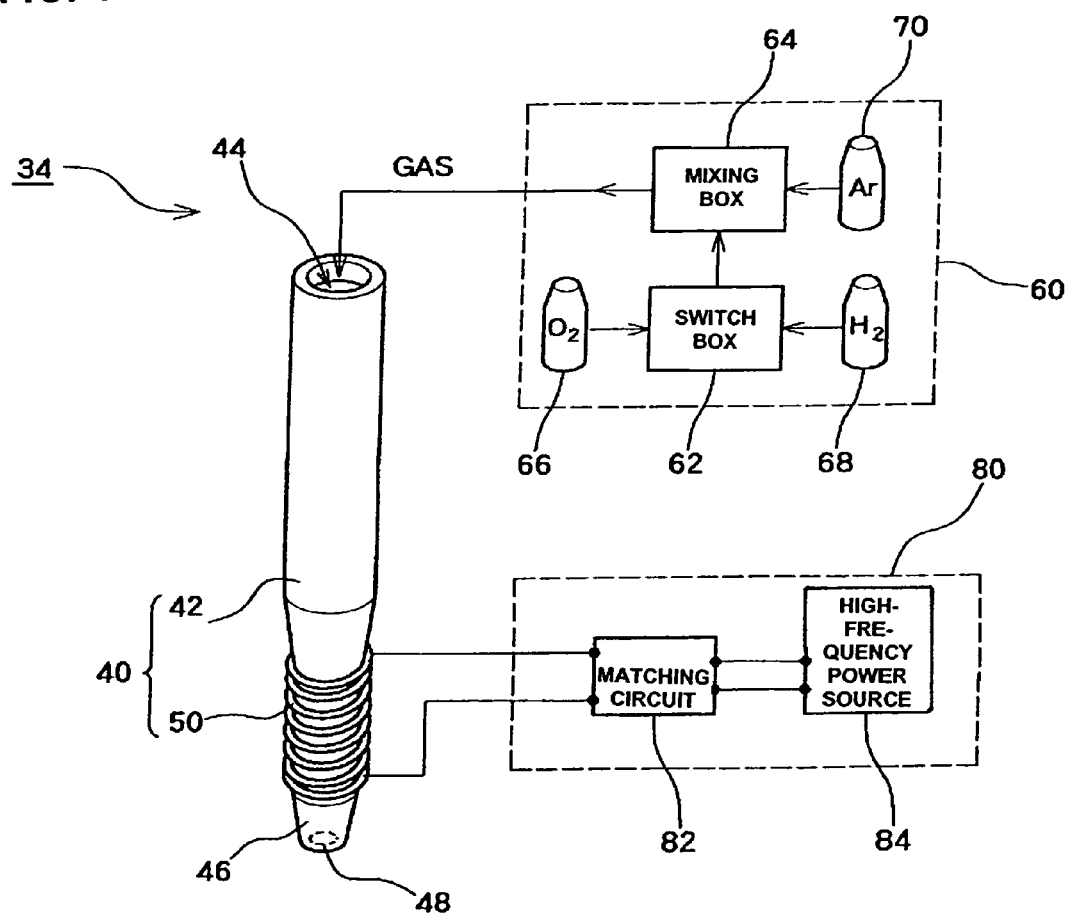
FIG. 4 shows the overall structure of the microplasma generator according to an embodiment of the present invention.

FIG. 4 shows the overall structure of the microplasma generator 34. The microplasma generator 34 is comprised of the capillary 40 fitted, as described earlier, to the tip end of the arm 32 (see FIGS. 1 and 2) and the gas supply unit 60 and high-frequency power supply unit 80 that are connected to the capillary 40.

The capillary 40 is a tubular member so that a bonding wire passes therethrough, and it is used both for surface treatment and for bonding processing. In order to function for effecting surface treatment, the capillary 40 includes a capillary main body 42 formed of an insulating material and a high-frequency coil 50 wound about the outer circumference of the tip end portion 46 of capillary main body 42. When performing surface treatment, a microplasma for surface treatment is generated in the interior of the narrow tubular member (the capillary main body 42) made of an insulating material, and this microplasma is ejected from the opening in the tip end thereof and irradiated onto the bonding subject The irradiated area is limited by, for instance, the size of the tip end opening of the capillary 40 and is extremely narrow; accordingly, the ejected plasma can be called a microplasma. Accordingly, from the perspective of the performing surface treatment using a microplasma, the capillary 40 can be called a plasma capillary; however, because the capillary 40 is used in bonding processing as well in addition to the surface treatment, it is merely called the capillary 40 in the following description.

The capillary main body 42 is an ordinary capillary that is generally used in bonding and it has substantially the same dimensions and the same shape, except for a through-hole 44 being formed for supplying the gas constituting the source of microplasma and the portion about which the high-frequency coil 50 is wound. In one example of dimensions of ordinary capillary, the length is approximately 11 mm, the diameter of the thick portion is approximately 1.6 mm, the diameter on the gas supply side of the through-hole 44 is approximately 0.8 mm, and the diameter of the opening 48 in the tip end is approximately 0.05 mm. For the material of capillary main body 42, a ceramic such an alumina can be used, as in an ordinary capillary generally used in bonding. The size of the opening 48 in the tip end thereof can be selected according to the diameter of the bonding wire 2 and the area of the bonding pad and the like.

The high-frequency coil 50 wound near the tip end portion 46 of the capillary main body 42 is a conducting wire having a winding of a few turns. While not shown in FIG. 3, an igniter for igniting plasma is provided in the vicinity of the high-frequency coil.

The gas supply unit 60 has functions for supplying the gas that constitutes the source of the microplasma. More specifically, the gas supply unit 60 is comprised of a switch box 62 for switching the surface treatment gas, a mixing box 64 for mixing the surface treatment gas and the carrier gas, various gas sources, and various pipelines for connecting those and the capillary 40. For the various gas sources here, an oxygen gas source 66 for oxidation treatments, a hydrogen gas source 68 for reduction treatments, and an argon gas source 70 for the carrier gas are used, respectively.

The switch box 62 has functions for switching between the oxygen gas source 66 and the hydrogen gas source 68, depending on whether the surface treatment is oxidation or reduction, and sending oxygen or hydrogen gas at a suitable flow volume to the mixing box 64. The mixing box 64 mixes the oxidation gas or reduction gas sent from the switch box 62 with the carrier gas in a suitable mixture ratio and supplies this into the through-hole 44 in the capillary 40. The control of the switch box 62 and the mixing box 64 is conducted by the controller 90. Since the quantity of gas consumed is very small, small gas tanks can be used for the gas sources. Needless to say, the switch box 62 and the mixing box 64 can be connected by dedicated pipelines from external gas sources.

When oxygen gas is used as the surface treatment gas source, foreign matter including organic matter on the surface of the bonding subject can be removed by oxidation. When hydrogen gas is used as the surface treatment gas source, oxidized films on the surface of the bonding subject can be removed by reduction. Other than this, depending on the bonding subject, a fluorine-based etching gas may also be used as the surface treatment gas source. Accordingly, for surface removal processing, the properties of the microplasma can be switched according to the bonding subject, so that, for example, for bonding pads, hydrogen gas is used for removing metal oxide films formed thinly on the surface thereof, while, for bonding leads, oxygen gas is used for removing organic matter adhering to the surface thereof.

Furthermore, when the bonding wire of gold is inserted into the plasma region, the material of the bonding wire 2 can be turned into particles. The plasma region atmosphere at this time can be made reducing or oxidizing according to the reactivity of the bonding wire material. Accordingly, in regards to the case where the bonding wire is turned into particles by plasma in a reducing atmosphere, in order to perform processing for depositing the same material as the bonding wire 2 on the surface of the bonding subject, the gas type can be switched to a reducing type in the switch box 62, and the position of the tip of the bonding wire can be changed so as to be in the plasma region by the position changing unit 206. The surface deposition processing can be performed accordingly.

The high-frequency power supply unit 80 has functions for supplying high-frequency electric power to the high-frequency coil 50 wound on the capillary 40 for the purpose of sustaining the generation of the microplasma, and H: is comprised of a matching circuit 82 and a high-frequency power source 84. The matching circuit 82 is a circuit for suppressing power reflection when supplying the high-frequency power to the high-frequency coil 50, for which, for example, circuitry forming an LC resonant circuit between the high-frequency coil 50 is used. For the high-frequency power source 84, a power supply having a frequency of 13.56 MHz or 100 MHz, for example, can be used. The level of the power supplied is determined giving consideration to the type and flow volume of the gas supplied from the gas supply unit 60, and the microplasma stability, and the like. The control of the high-frequency power source 84 is performed by the controller 90.

FIGS. 5(a) and 5(b) show the manner of a microplasma generated in the interior of the capillary 40 by the action of the microplasma generator 34. FIG. 5(a) shows the manner of generation of a reducing microplasma 301 or an oxidizing microplasma 302 in surface removal processing, and FIG. 5(b) shows the manner of generation of a microplasma 303 that includes sputtered fine particles of the material of the bonding wire 2, for example, sputtered fine particles of gold, in surface deposition processing.

To generate a microplasma, the following procedures are conducted. First, the gas supply unit 60 is controlled; and gas, of a suitable gas type and at a suitable flow volume, is supplied to the through-hole 44 in the plasma capillary 40. The supplied gas flows from the opening 48 in the tip end to the outside. Next, the high-frequency power supply unit 80 is controlled, and suitable high-frequency power is supplied to the high-frequency coil 50. These suitable conditions can be found beforehand by experiment. Then, a high-frequency ignition pulse is applied to an igniter (not shown). If the supplied gas conditions and the high-frequency power conditions are suitable, induction plasma is generated by the high-frequency power in the flowing gas. In other words, plasma is ignited. Once ignition has occurred, the generation of the microplasma by the high-frequency power from the high-frequency coil 50 will continue, even if the high-frequency ignition pulse is extinguished. The plasma region 52 in which the supplied gas is generated into plasma is, roughly, on the gas downstream side from the position where the high-frequency coil 50 is deployed. The microplasma 300 generated is ejected from the tip end opening 48 of the plasma capillary 40.

In the case of surface removal processing, as shown in FIG. 5(*a*), the bonding wire 2 is pulled up, by the position changing unit 206, to be sufficiently high at the upper end of the interior of the capillary 40, so that the tip of the wire 2 is not positioned inside the plasma region 52, thus being at a surface removal position. In this condition, the microplasma generated by the plasma region 52 can be made either oxidizing or reducing, and such microplasma is ejected from the tip end opening 48, thus removing foreign matter or contaminants on the surface of the bonding subject.

On the other hand, when surface deposition processing is performed, the bonding wire 2 is, as shown in FIG. 5(*b*), inserted by the position changing unit 206 into the interior of the capillary 40, so that the tip of the wire 2 is positioned inside of the plasma region 52, thus being at a surface deposition position. If the bonding wire 2 is, for example, a gold wire, the gas can be a reducing gas. As a result, the material of the bonding wire 2 will be finely turned into particles in the plasma region 52, the microplasma 303 containing this fine sputtered particles of gold will be ejected from the tip end opening 48, and a material that is the same as the bonding wire 2 is deposited on the surface of the bonding subject.

Furthermore, by completely stopping the action of the microplasma generator 34, the capillary 40 can be made to function as a wire bonding capillary. In this case, the position changing unit 206 causes the position of the bonding wire 2 to protrude by a necessary amount from the tip end opening 48 as in a normal wire bonding action.

Figure 6:
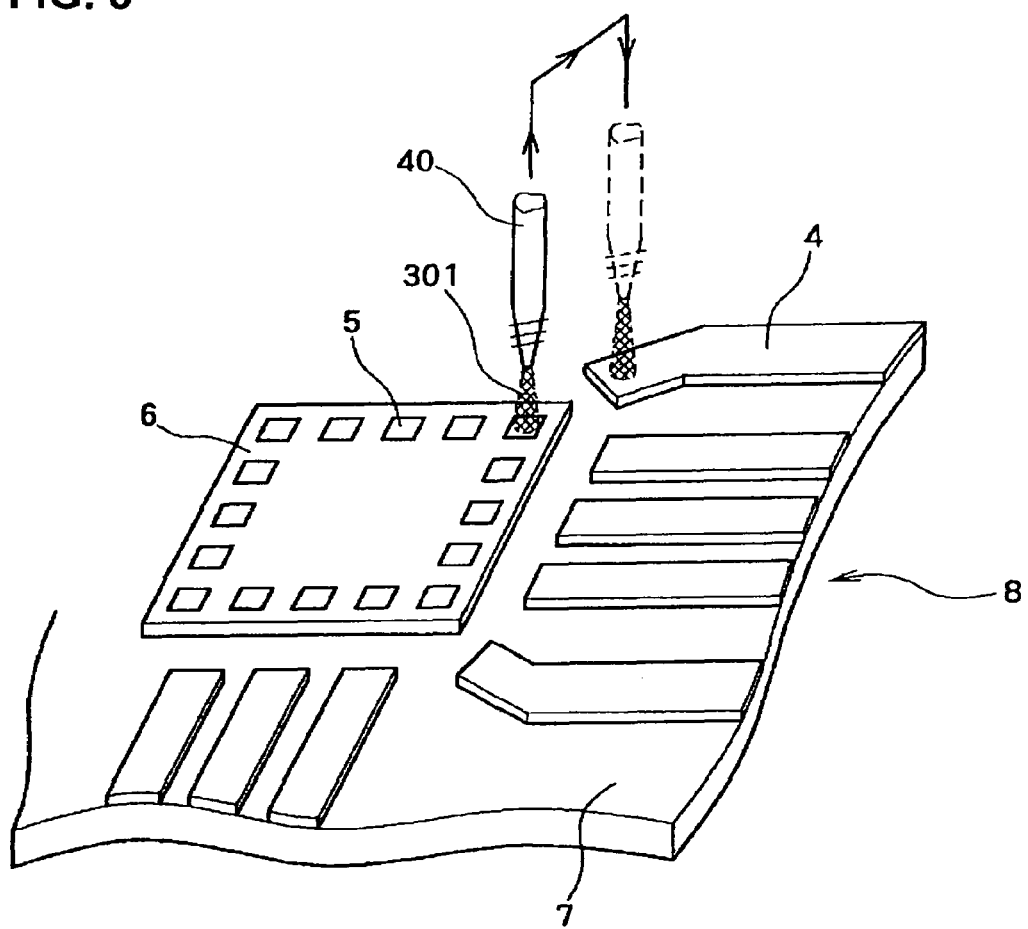
FIG. 6 shows how a bonding subject is irradiated by a microplasma according to an embodiment of the present invention.
Figure 7A:
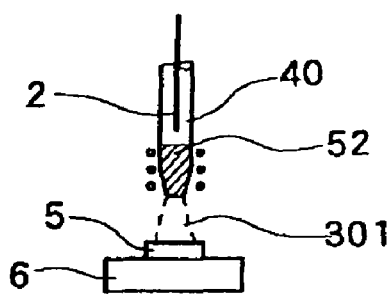
FIGS. 7(a) through 7(e) shows the procedures for interconnectedly performing surface treatment that includes removing foreign matter or contaminants on the bonding subjects and depositing a suitable material on the bonding subjects, and bonding processing, according to an embodiment of the present invention.
Figure 7B:
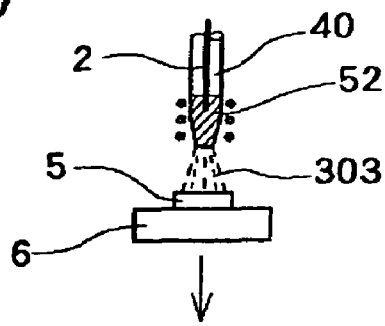
Figure 7C:
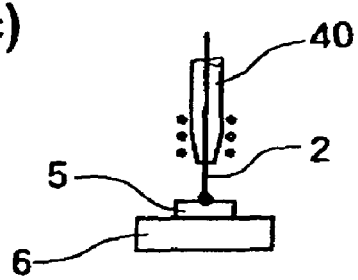
Figure 7D:
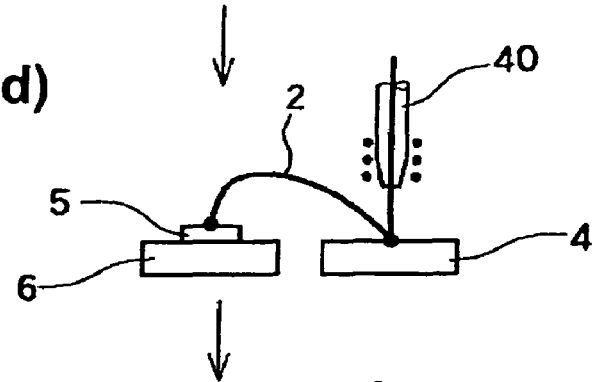
Figure 7E:
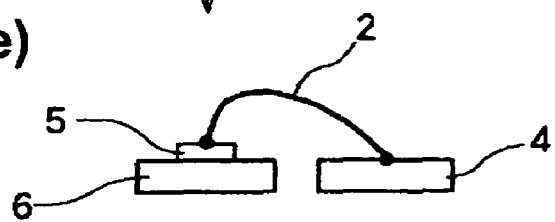

In the above-described example dimensions, the diameter of the opening 48 of the capillary main body 42 (or of the capillary 40) is about 0.05 mm; as a result, by suitably taking the distance to the bonding subject, it is possible to have only the narrow area of the bonding pad and bonding leads irradiated, either by reducing the microplasma 301, or the oxidizing microplasma 302, or the microplasma 303 that includes the fine sputtered particles of gold. Furthermore, even with the reducing microplasma 301 or oxidizing microplasma 302 being ejected, if the bonding subject is far away from the capillary 40, these microplasmas are not act on the bonding subject Accordingly, by raising and lowering the capillary 40, the action of this microplasma on the bonding subject can be controlled. FIG. 6 shows one example of how the above is controlled, in which the bonding subject 8 is a chip 6 mounted on a circuit board 7.

FIG. 6 also shows how, by way of moving the position of the capillary 40 by suitably controlling the surface treatment XYZ drive mechanism 30, irradiation with the reducing microplasma 301, from the capillary 40, is done at positions of the bonding pad 5 on the chip 6 and the bonding lead 4 on the circuit board 7.

The actions of the wire bonding apparatus 200 structured above will be described below with reference to FIGS. 7(*a*) through 7(*e*). FIGS. 7(*a*) through 7(*e*) show the process steps of the procedures for interconnectedly performing surface treatment, which includes removing foreign matter or contaminants on the bonding subjects and depositing a suitable material on the bonding subjects, and bonding processing— To perform wire bonding, the wire bonding apparatus 200 is started up, and the bonding subject 8 is transported by the transporter mechanism 12 to the bonding stage 204 and positioned (positioning step).

Then, by command from the controller 90, the microplasma generator 34 is started up, and the microplasma is ignited and generated in the capillary 40. Prior to this, the bonding wire 2 is pulled up, by the position changing unit 206, to a sufficiently high position in the interior of the capillary 40. The gas can be only the carrier gas, and the surface treatment gas is not yet mixed in. At this time, the capillary 40 is distantly separated from the bonding subject 8, and the microplasma is not acting at all (microplasma generation step).

Next, when the wire bonding program is started up, the capillary 40 comes to a high position directly above the first bonding pad 5 (bonding pad positioning step). Then, by command from the controller 90, the gas is a reducing gas, that is, hydrogen, which is mixed together with the carrier gas; and the microplasma is made to be the reducing microplasma 301 (microplasma setting step).

Next, the capillary 40 descends toward the bonding pad 5. This descent is performed so that the tip end of the capillary 40 stops at a height, exactly above the bonding pad 5, whereat this bonding pad 5 is optimally irradiated by the reducing microplasma 301, and the reducing microplasma 301 removes there the thin oxidized film from the surface of the bonding pad 5, thus effecting a clean surface on the bonding pad 5 (bonding pad surface removal processing step). How this is done is shown in FIG. 7(*a*).

Next, the controller 90 sends an instruction to the position changing unit 206, causing the position of the tip of the bonding wire 2 to be changed so that the tip of the bonding wire 2 is inserted inside the plasma region 52 of the capillary 40. If the bonding wire 2 is a gold wire, the microplasma is unchanged from a reducing atmosphere. Accordingly, the portion of the bonding wire 2 inserted into the plasma region 52 is acted on by the reducing microplasma 301 and made into fine particles. Then, the bonding pad 5 is irradiated by the microplasma 303 containing the sputtered fine gold particles. As a result, a material that is the same as the bonding wire 2 is deposited, forming a thin gold film, on the clean surface of the bonding pad 5 (bonding pad surface deposition processing step). How this is done is shown in FIG. 7(*b*).

Next, by instruction from the controller 90, the action of the microplasma generator 34 is stopped. Then, if necessary, the capillary 40 is pulled up, an instruction is sent to the position changing unit 206, and the position of the tip of the bonding wire 2 is made to protrude from the tip end of the capillary 40. Thereupon, the content of the bonding program becomes the ordinary wire bonding processing, and, as a result, following a known processing sequence, first bonding is performed at the bonding pad 5, and then second bonding is performed at the bonding lead 4 (bonding processing step). How this is done is shown in FIGS. 7(*c*) and 7(*d*). At this time, on the bonding pad 5, the surface oxidized film has previously been removed and the same material as the bonding wire 2 is deposited on this clean surface in the condition of a thin film; accordingly, bonding processing is performed more stably. How this looks with the bonding processing finished in this manner is shown in FIG. 7(*e*).

When the connection between one bonding pad 5 and bonding lead 4 group is finished in this way, the capillary 40 is moved to directly above the next bonding pad 5, and the procedures described in the foregoing are repeated.

In the above description, the surface treatment on the bonding pad 5 is an oxidized film removal that uses the reducing microplasma 301, with the surface deposition processing being done with the use of this reducing atmosphere as is. However, for the surface removal processing, when necessary, the gas type can be switched to oxygen prior to the oxidized film removal, making the microplasma an oxidizing one, for removing foreign matter including organic matter. This may also be conducted in combination with organic matter removal, oxidized film removal, or electrode etching using another etching gas, or the like. Such gas type setting can be made something that the user can select, as an input to the controller 90.

EMBODIMENT 2

Surface removal processing→surface deposition processing→bonding processing, based on the microplasma generator 34 shown in FIG. 3 and the position changing unit 206, can be applied to a bump bonding apparatus.

Bump bonding apparatus is an apparatus for forming gold bumps in flip chip technology. More specifically, such an apparatus uses the principle of wire bonding to a bonding pad on a chip to bond gold wires and make those gold bumps. Thus it might be characterized as equivalent to an ordinary wire bonding process from which the second bonding is eliminated. Accordingly, such an apparatus corresponds to the wire bonding apparatus 200 shown in FIG. 1, in which the bonding subject 8 transported by the transporter mechanism 12 is a completed wafer on which completed LSIs are arrayed.

When the bonding subject 8 is thus a completed wafer, in the bonding stage 204, the surface removal processing→surface deposition processing→bonding processing sequence is performed for the respective bonding pads 5 in a plurality of completed LSIs. FIGS. 8(a) through 8(d) show the actions of a bump bonding apparatus configured such that the particulars of the elements other than the transporter mechanism 12 are substantially the same as those of the wire bonding apparatus 200.

Figure 8A:
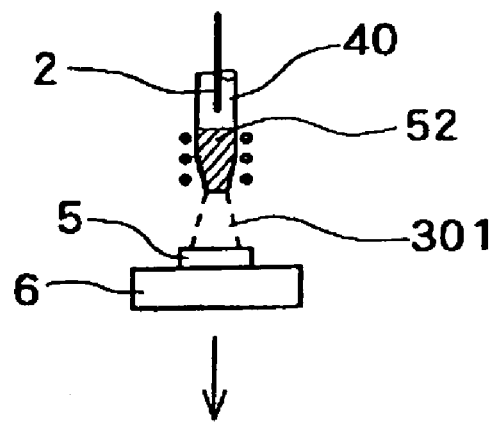
FIGS. 8(a) through 8(d) show the actions of a bump bonding apparatus according to an embodiment of the present invention.

FIG. 8(a) shows a step in which the gas is hydrogen, the microplasma is of a reducing type, the position of the tip of the bonding wire 2 in the interior of the capillary 40 is set outside the plasma region 52, and the oxidized film on the surface of the bonding pad 5 is removed. These particulars are substantially the same as those described relative to FIG. 7(a).

Figure 8B:
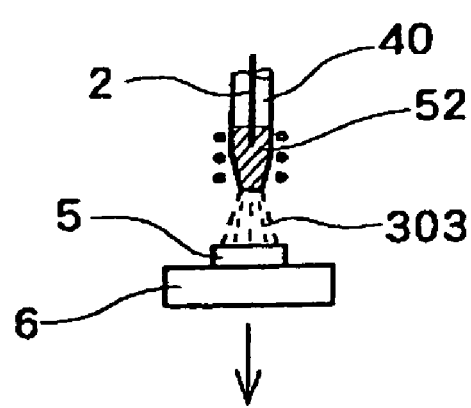

FIG. 8(b) shows a step in which the bonding wire 2 is a narrow gold wire, and, with the microplasma kept as a reducing one, the position of the tip of the bonding wire 2 in the interior of the capillary 40 is set in the interior of the plasma region 52, and a material that is the same as the bonding wire 2 is deposited on the surface of the bonding pad 5. These particulars are substantially the same as those described relative to FIG. 7(b).

Figure 8C:
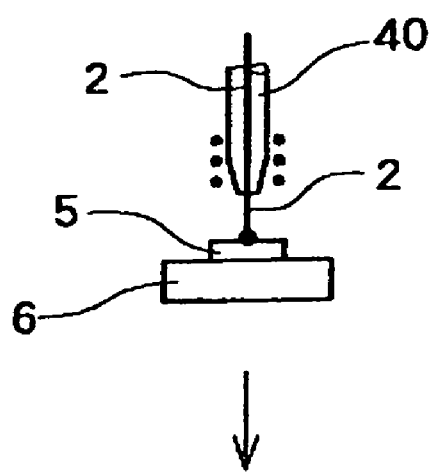

FIG. 8(c) shows how the action of the microplasma generator 34 is stopped, the position of the tip of the bonding wire 2 is made to protrude from the tip end of the capillary 40, and ordinary wire bonding is performed. These particulars are substantially the same as those described relative to FIG. 8(c).

Figure 8D:
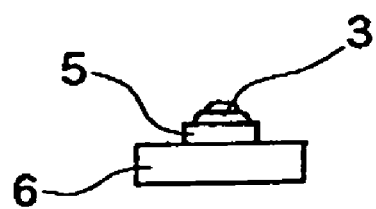

FIG. 8(d) shows how, when the bonding wire 2 is made a gold wire, in this manner, a gold bump 3 is formed on the bonding pad 5.

EMBODIMENT 3

The capillary 40 of the wire bonding apparatus 200 shown in FIG. 1 has both functions for performing surface treatment and functions for performing bonding processing, and it performs surface treatment and bonding processing interconnectedly on individual items of the same bonding subject on the same processing stage.

Figure 9:
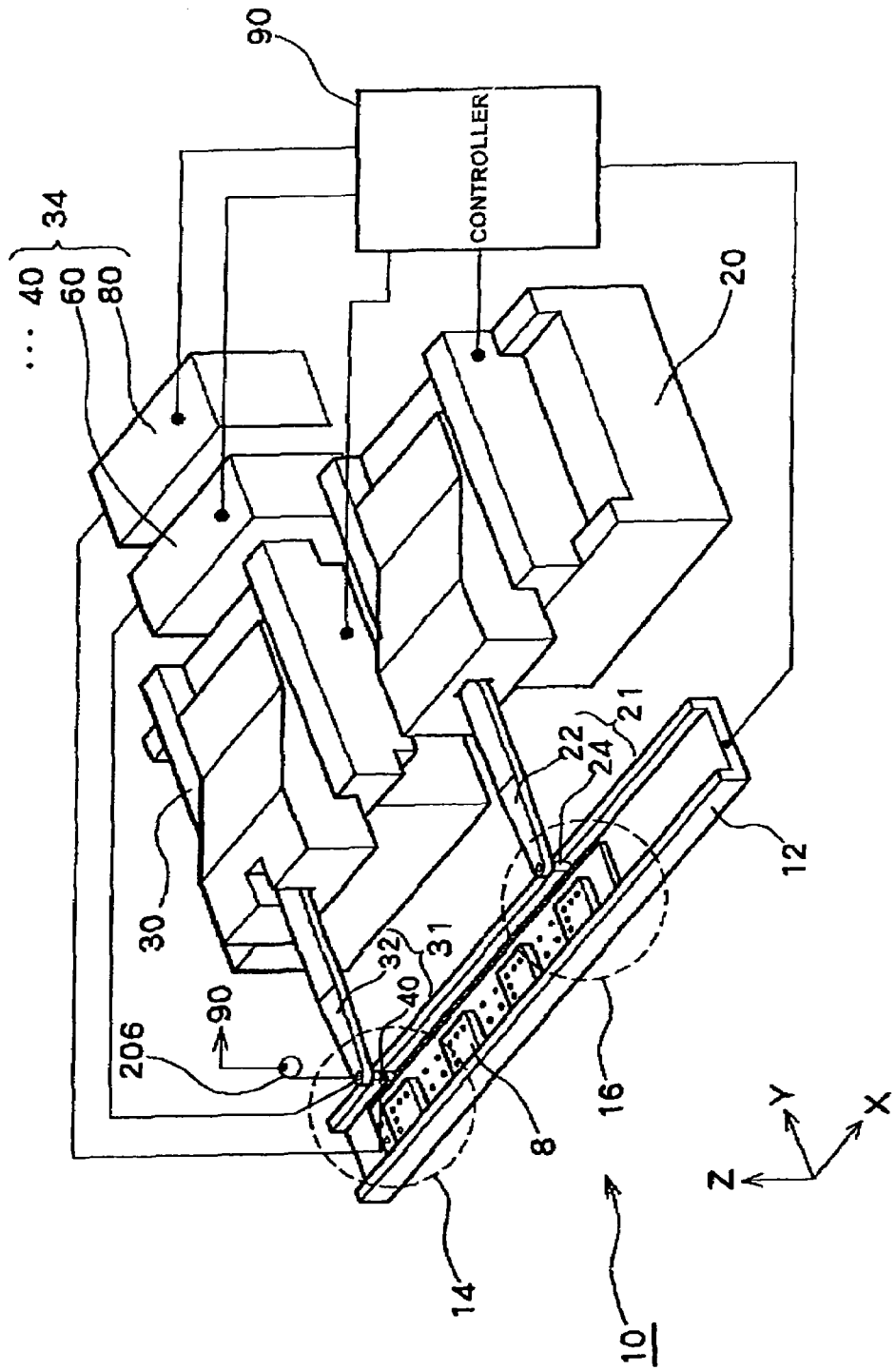
FIG. 9 shows a dual-stage, dual-capillary type wire bonding apparatus according to an embodiment of the present invention.

These surface treatment functions and bonding functions of the capillary can be separated. FIG. 9 shows such a wire bonding apparatus 10.

In the bonding apparatus of FIG. 9, a surface treatment stage 14 and a bonding stage 16 are respectively deployed, and a surface treatment XYZ drive mechanism 30 and a bonding XYZ drive mechanism 20 are used therefor, respectively; and the capillary for performing surface treatment is the plasma capillary 40 with its positional movement effected by the surface treatment XYZ drive mechanism 30, and the capillary for performing bonding processing is the bonding capillary 24 with its positional movement effected by the bonding XYZ drive mechanism 20.

A wire bonding apparatus 10 configured in such manner includes two XYZ drive mechanisms, two capillaries, two arms, and two processing stages, so that it might be called a dual-stage, dual-capillary type wire bonding apparatus. In the sense of making a comparison therewith, the wire bonding apparatus 200 shown in FIG. 1 can be called a single-stage, single-capillary type.

In the following description, the same reference numerals is used for the same elements as described in connection with FIGS. 1 to 8, and no further detailed descriptions thereof will be provided.

The wire bonding apparatus 10 shown in FIG. 9 is comprised of a transporter mechanism 12 for holding the bonding subject 8 and transporting it to a prescribed position, a bonding arm 21 having a bonding capillary 24 fitted to the tip end of its bonding arm main body 22, a bonding XYZ drive mechanism 20 for movement-driving the bonding arm 21, a plasma arm 31 having a plasma capillary 40 fitted to the tip end portion of a plasma arm main body 32, a surface treatment XYZ drive mechanism 30 for movement-driving the plasma arm 31, a position changing unit 206 for changing the position of the bonding wire passing through the plasma capillary 40, a surface treatment gas supply unit 60, a surface treatment high-frequency power supply unit 80, and a controller 90 for integrally controlling the elements. The plasma capillary 40, gas supply unit 60, and high-frequency power supply unit 80 form a microplasma generator 34.

The bonding XYZ drive mechanism 20 has functions capable of moving the bonding arm 21 to any desired position in the X axis direction and Y axis direction as shown in FIG. 9, and it also drives the bonding capillary 24 up and down in the Z axis direction at that desired position. The bonding arm 21 is comprised of the bonding arm main body 22 and the bonding capillary 24 fitted to the tip end thereof. The bonding XYZ drive mechanism 20 has a high-speed XY table for carrying the bonding arm main body 22, and it has also a high-speed Z motor for swing-driving the bonding arm main body 22 and moving the bonding capillary 24 fitted to the tip end thereof up and down. For positioning, a servo mechanism using sensors is used.

The bonding arm 21 is, as described above, comprised of the bonding arm main body 22 and the bonding capillary 24 fitted to the tip end thereof, and it has functions for supplying ultrasonic energy to the bonding capillary 24 by an ultrasonic transducer (not shown in the drawings) and pressing the bonding wire that passes through the bonding capillary 24 against the bonding subject 8. The bonding capillary 24, as is commonly known, is a narrow tubular member through which a bonding wire passes. A thin wire of gold or aluminum or the like can be used as the bonding wire. In FIG. 9, furthermore, mechanisms such as a spool for supplying the bonding wire, or a clamper for clamping and releasing the movement of the bonding wire, are omitted.

The surface treatment XYZ drive mechanism 30 has functions for moving the plasma arm main body 32 having at the tip end thereof the plasma capillary 40 for surface treatment to any desired position in the X axis direction and Y axis direction indicated in FIG. 1, and it also moves the tip end of the plasma capillary 40 up and down in the Z axis direction at that desired position. The plasma arm 31 is comprised of the plasma arm main body 32 and the plasma capillary 40 that is fitted to the tip end thereof. The outer appearance of the plasma arm 31 is the same as that shown in FIG. 2.

The surface treatment XYZ drive mechanism 30 has substantially the same functions as the bonding XYZ drive mechanism 20. The difference is that, whereas the bonding XYZ drive mechanism 20 requires a high-speed, high-precision movement drive, the surface treatment XYZ drive mechanism 30 does not require all that much positioning precision, The reason for this is that the area where surface treatment is applied is wider than the projection area where the wire is connected to a bonding pad or bonding lead and some degree of variation is tolerable therein. Accordingly, the performance requirements for the XY table and Z motor forming the surface treatment XYZ drive mechanism 30 can be relaxed as compared to those for the bonding XYZ drive mechanism 20.

As describe above, the surface treatment XYZ drive mechanism 30, plasma arm main body 32, and plasma capillary 40 have substantially the same functions as the bonding XYZ drive mechanism 20, bonding arm main body 22, and bonding capillary 24. Accordingly, by calibrating the position of the tip end of the plasma capillary 40 and the position of the tip end of the bonding capillary 24, the movement control for both can be executed in the same sequence. In other words, by applying the same sequencing program, the movement of the tip end of the bonding capillary 24 and the movement of the tip end of the plasma capillary 40 relative to the bonding subject 8 can be made altogether the same. More specifically, when the same sequencing program is given simultaneously to the surface treatment XYZ drive mechanism 30 and the bonding XYZ drive mechanism 20, the movement of the tip end of the plasma capillary 40 and the movement of the tip end of the bonding capillary 24 can be made the same. In short, it is as though the two units, that is, the surface treatment apparatus and the bonding apparatus, can be made so that they perform exactly the same movements simultaneously.

The name of the plasma capillary 40 is changed to distinguish it from the bonding capillary 24; however, its particulars are substantially the same as for the capillary 40 shown in FIG. 1. Similarly, the particulars for the arm main body 32 are substantially the same as for the bonding arm main body 22 shown in FIG. 1. The functions of the position changing unit 206, except for the fact that the position of the tip of the bonding wire 2 is not made the bonding position, are the same as the particulars shown in FIG. 3. More specifically, the position changing unit 206 changes the position of the tip of the bonding wire 2 in the interior of the plasma capillary 40 between the outside and inside of the plasma region 52. The particulars for the gas supply unit 60 and high-frequency power supply unit 80 forming the microplasma generator 34 are also the same as those described relative to FIG. 4.

The controller 90, which is connected to the transporter mechanism 12, the bonding XYZ drive mechanism 20, the surface treatment XYZ drive mechanism 30, the gas supply unit 60, and the high-frequency power supply unit 80, and the like, is an electronic circuit unit having functions for controlling those elements so that surface treatment is performed on the bonding subject 8, and then bonding processing is performed. Those functions can be performed by software. In other words, they can be performed by executing a wire bonding program that embodies routines for interconnectedly performing surface treatment and bonding processing. Some of those functions may be effected with hardware.

The actions of the wire bonding apparatus 10 structured as above will be described below with reference to FIGS. 10(a) through 10(g). FIGS. 10(a) through 10(g) show the procedures for interconnectedly performing surface treatment, which includes removing foreign matter or contaminants on the bonding subjects and depositing a suitable material on the bonding subjects, and bonding processing.

To perform wire bonding, the wire bonding apparatus 10 is started up, and the bonding subject 8 is transported by the transporter mechanism 12 to the surface treatment stage 14 and positioned (surface treatment positioning step).

Then, by command from the controller 90, the microplasma generator 34 is started up, and the microplasma is ignited and generated in the plasma capillary 40. Prior thereto, the bonding wire 2 is pulled up, by the functioning of the position changing unit 206, to a sufficiently high position in the interior of the capillary 40. The gas is the carrier gas only, and the surface treatment gas is not yet mixed in. At this point, the plasma capillary 40 is distantly separated from the bonding subject 8, and the microplasma is not acting at all (microplasma generation step).

Next, when the wire bonding program is started up, the same positioning as in the bonding stage 16 is performed in the surface treatment stage 14, and the plasma capillary 40 is moved to a high position directly above the first bonding pad 5 (bonding pad positioning step). Then, by command from the controller 90, the gas is made to be a reducing gas type, that is, hydrogen, which is mixed together with the carrier gas, and the microplasma is made a reducing microplasma 301 (microplasma setting step).

Figure 10A:
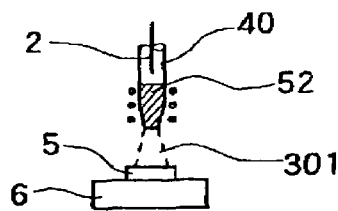
FIGS. 10(a) through 10(g) show the procedures for interconnectedly performing surface treatment that includes removing foreign matter or contaminants on the bonding subjects and depositing a suitable material on the bonding subjects, and bonding processing, in the dual-stage, dual-capillary type bonding apparatus.
Figure 10B:
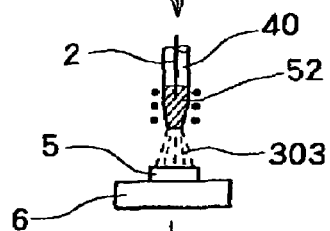

The wire bonding program next lowers the plasma capillary 40 toward the bonding pad 5. Here, the position of the tip end of the plasma capillary 40 is offset beforehand by the measure of the height of the action of the reducing microplasma 301 from the position of the tip end of the bonding capillary. As a result, when the wire bonding program performs the processing for effecting the first bonding, the tip end of the plasma capillary 40 will stop, exactly above this bonding pad 5, at a height at which the reducing microplasma 301 optimally irradiate the bonding pad 5. The reducing microplasma 301 removes there the thin oxidized film on the surface of the bonding pad 5, effecting a clean surface on the bonding pad 5 (bonding pad surface removal processing step). How this is done is shown in FIG. 10(a).

Next, the controller 90 sends an instruction to the position changing unit 206, and the position of the tip of the bonding wire 2 is changed so that the tip of the bonding wire 2 is inserted in the plasma region 52 of the plasma capillary 40. If the bonding wire 2 is a narrow gold wire, the microplasma is unchanged from a reducing atmosphere; as a result, here, the portion of the bonding wire 2 inserted in the plasma region 52 is acted on by the reducing microplasma 301 and turned into fine particles. Then irradiation toward the bonding pad 5 by the microplasma 303 containing the sputtered fine gold particles occurs. As a result, material that is the same as the bonding wire 2 is deposited on the clean surface of the bonding pad 5, and a thin gold film is formed (bonding pad surface deposition processing step).

Next, the wire bonding program pulls the plasma capillary 40 upward and moves it directly above the bonding lead 4 (bonding lead positioning step). Prior to this, the controller 90 sends an instruction to the position changing unit 206, and the position of the tip of the bonding wire 2 is changed so that the tip of the bonding wire 2 is moved outside the plasma region 52 of the plasma capillary 40. The gas type is unchanged, and the microplasma is kept to be a reducing one.

Figure 10C:
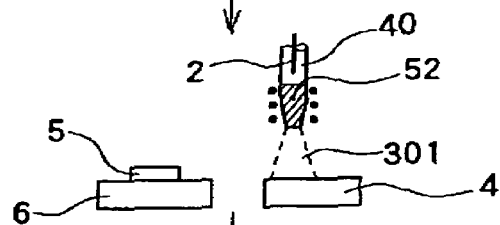

The wire bonding program next lowers the plasma capillary 40 toward the bonding lead 4. Then, the tip end of the capillary 40 stops exactly above that bonding lead 4, at a height whereat the reducing microplasma 301 is optimally irradiated to the bonding lead 4. There, the reducing microplasma 301 removes the oxidized film from the bonding lead 4 (bonding lead surface removal processing step). How this is done is shown in FIG. 10(c).

Figure 10D:
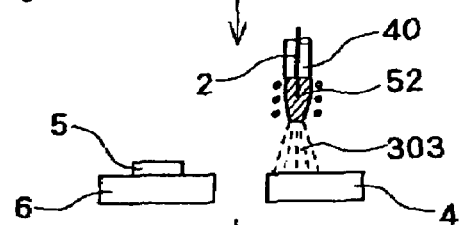

Next, the controller 90 sends an instruction to the position changing unit 206, and the position of the tip of the bonding wire 2 is changed so that the tip of the bonding wire 2 is inserted into the plasma region 52 of the plasma capillary 40. Since the microplasma is unchanged from a reducing atmosphere, the portion of the bonding wire 2 inserted in the plasma region 52 is acted on by the reducing microplasma 301 and turned into fine particles. Then irradiation toward the bonding lead 4 by the microplasma 303 containing the sputtered fine gold particles occurs. As a result, material that is the same as the bonding wire 2 is deposited on the clean surface of the bonding lead 4, and a thin gold film is formed (bonding lead surface deposition processing step). How this is done is shown in FIG. 10(d).

Thereafter, in conjunction with the progress of the wire bonding program, the controller 90 controls the microplasma generator 34 and the position changing unit 206 and switching the microplasma properties between those for surface removal processing and those for surface deposition processing, so that surface removal processing and surface deposition processing are successively and progressively performed on the surfaces of the bonding pads 5 and the bonding leads 4. Then, when the wire bonding program finishes, surface removal processing and surface deposition processing on all of the bonding pads 5 and all of the bonding leads 4 of the bonding subject 8 finish (surface treatment finishing step).

Figure 10E:
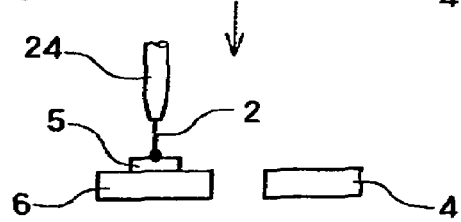
Figure 10F:
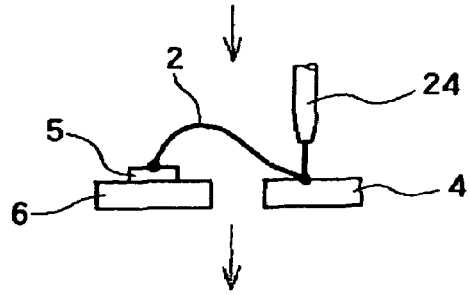
Figure 10G:
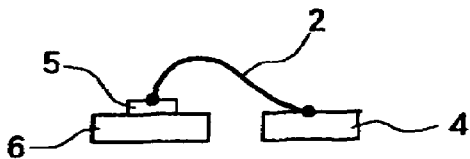

Next, by command from the controller 90, the transporter mechanism 12 transports the bonding subject 8 on which the surface treatment has finished to the bonding stage 16 and positions it (bonding process positioning step). Then, the wire bonding program is started up, and, as is commonly known, first bonding is performed on the bonding pad 5, and then second bonding is performed on the bonding lead 4 (bonding processing step). How this is done is shown in FIGS. 10(e) and 10(f). At this point, at the bonding pads 5 and the bonding leads 4, the surface oxidized film is removed, and, thereon, material that is the same as the bonding wire 2 is deposited in thin-film form, so that bonding processing can be performed more stably. How it looks when bonding processing has been done in this way is shown in FIG. 10(g). The above is repeated; and, when the wire bonding program finishes, the bonding processing related to all of the bonding pads 5 and all of the bonding leads 4 on the bonding subject 8 finish (bonding processing finishing step).

In the above description, the surface treatment on the bonding pad 5 is an oxidized film removal using the reducing microplasma 301, with the surface deposition processing done with the use of this reducing atmosphere as is. However, for the surface removal processing, when necessary, the gas can be switched to an oxygen type prior to the oxidized film removal, making the microplasma an oxidizing type, for removing foreign matter including organic matter. This may also be conducted in combination with organic matter removal, oxidized film removal, or electrode etching using another etching gas, or the like. Such gas type setting can be made something that the user can select, as an input to the controller 90.

EMBODIMENT 4

A bump bonding apparatus can be configured on the basis of the two-stage wire bonding apparatus 10 shown in FIG. 9. In this configuration, the bonding subject 8 transported by the transporter mechanism 12, in the wire bonding apparatus 10 shown in FIG. 9, is a completed wafer on which completed LSIs are arrayed.

When the bonding subject 8 is a completed wafer, in the surface treatment stage 14, surface removal processing and surface deposition processing are performed, as surface treatments, on each of the bonding pads 5, respectively, for a plurality of LSIs; and when the surface treatment is finished on all of the bonding pads on one completed wafer, the wafer is transported to the bonding stage 16. There, bumps are formed on the bonding pads 5, respectively, for the plurality of completed LSIs, In this case, as is described relative to FIG. 10, the bump bonding program used in the bonding XYZ drive mechanism 20 can be applied in the same way to the surface treatment XYZ drive mechanism 30 to standardize the processing.

Figure 11A:
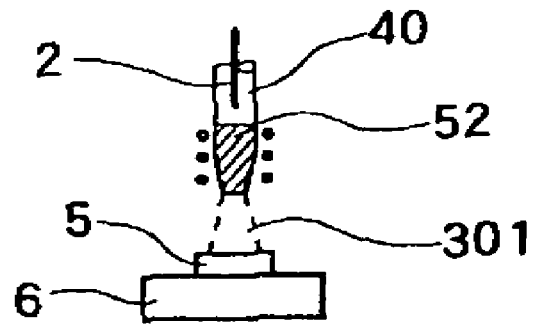
FIGS. 11(a) through 11(d) shows actions of a dual-stage, dual-capillary type bump bonding apparatus according to an embodiment of the present invention.

The action of the bump bonding apparatus, in which the constituting elements, excluding the transporter mechanism 12, are substantially the same as those of the wire bonding apparatus 10 shown in FIG. 9, will be described with reference to the process steps shown in FIGS. 11(a) through 11(d). The surface treatment is performed on the surface treatment stage 14 using the plasma capillary 40, FIG. 11(a) shows a step where the gas type is hydrogen, the microplasma is a reducing one, the position of the tip of the bonding wire 2 in the interior of the capillary 40 is set outside the plasma region 52, and the oxidized film on the surface of the bonding pad 5 is removed. The step here is substantially the same as that described relative to FIG. 8(a).

Figure 11B:
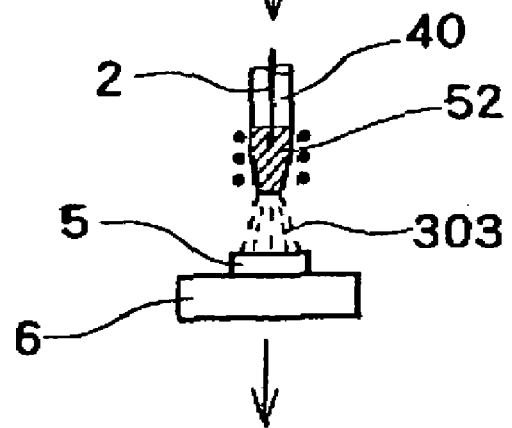

FIG. 11(b) shows a step in which, with the bonding wire 2 being a narrow gold wire, and the microplasma kept a reducing one, as is, the position of the tip of the bonding wire 2 in the interior of the capillary 40 is set in the interior of the plasma region 52, and material that is the same as the bonding wire 2 is deposited on the surface of the bonding pad 5. This step is substantially the same as that described relative to FIG. 8(b).

Thereafter, in conjunction with the progress of the bump bonding program, surface removal processing and surface deposition processing are successively performed on the bonding pads 5, respectively, at positions on the LSIs. When the bump bonding program has finished, the surface removal processing and surface deposition processing for all of the bonding pads 5 on the bonding subject 8 finish.

Figure 11C:
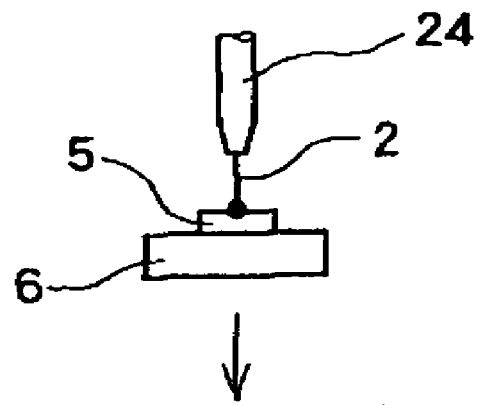
Figure 11D:
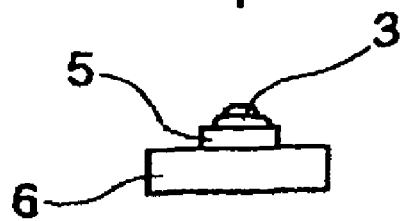
Figure 12A:
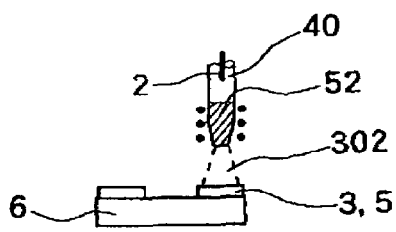
FIGS. 12(a) through 12(g) show the actions of a flip chip bonding apparatus according to an embodiment of the present invention.
Figure 12B:
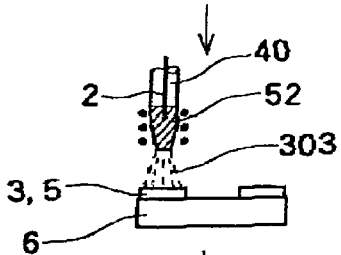
Figure 12C:
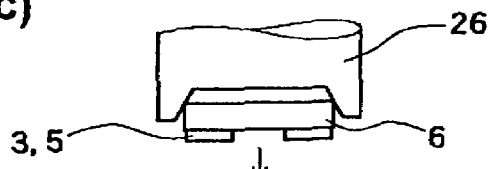
Figure 12D:
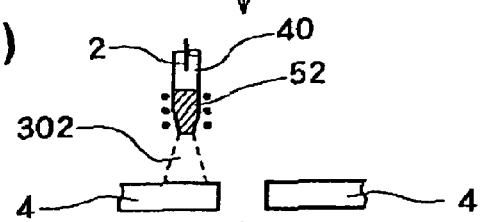
Figure 12E:
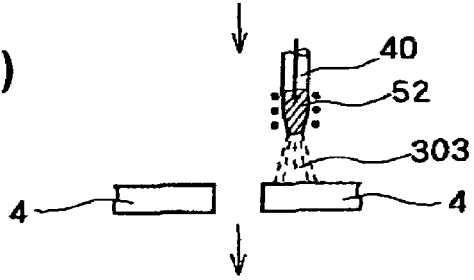
Figure 12F:
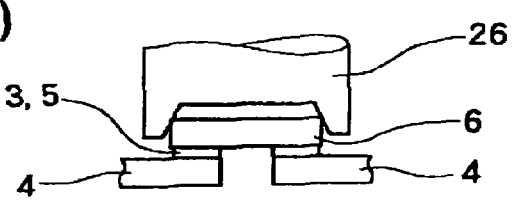
Figure 12G:
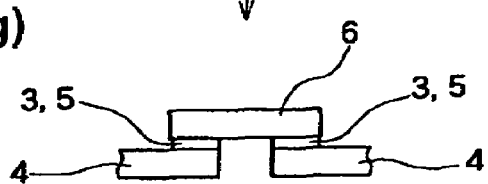

Next, by command from the controller 90, the transporter mechanism 12 transports the completed wafer whereon surface treatment is finished to the bonding stage 16 and positions it. Then, the bump bonding program is started up, gold wire is bonded, and a gold bump is formed, at a position on the first LSI, on the first bonding pad 5 thereof. How this is done is shown in FIG. 11(c). At this time, in the bonding pad 5, the surface oxidized film has been removed beforehand, and a thin gold film is deposited thereon; accordingly, the bonding processing can be performed more stably. The bonding processing is finished in this manner, and what the gold bump 3 that has been formed looks like is shown in FIG. 11(d). The above is repeated, and gold bumps 3 are formed on all of the bonding pads 5 in all of the LSIs on one wafer.

EMBODIMENT 5

The position changing unit 206 and the microplasma generator 34 described with reference to FIG. 3 can be applied to a flip chip bonding apparatus, The flip chip bonding apparatus is an apparatus for placing chips on which bumps have been formed as described with reference to FIGS. 11(*a*) through 11(*c*) face down on a circuit board. Accordingly, in flip chip bonding, what are connected are the bumps 3 on the chip 6 and the bonding leads 4. In view of the face down of the chip, the chip is inverted; and the bonding tool for the facedown bonding is not a bonding capillary but rather a collet that holds the chip placed face down. Thus, the specific configuration of the flip chip bonding apparatus differs considerably from that of the wire bonding apparatus shown in FIG. 9.

In the flip chip bonding apparatus, the stages where the position changing unit 206 and the microplasma generator 34 are applied are when performing surface removal processing and surface deposition processing on the chip bumps 3, prior to inverting the chip and holding it with the collet and when performing surface removal processing and surface deposition processing on the bonding leads 4 prior to facedown bonding with the collet. FIGS. 12(*a*) through 12(*g*) show the procedures used when applying the position changing unit 206 and the microplasma generator 34 in the flip chip bonding apparatus.

FIG. 12(*a*) is a step for removing foreign matter or contaminants on the surface and cleaning the gold bump 3 on the bonding pad 5. At this point, the gas type can be, for example, oxygen, and an oxidizing microplasma 302, is used. Depending on the case, the gas can be hydrogen, and a reducing microplasma 301 can be used. The position of the tip of the bonding wire 2 in the interior of the capillary 40 is set outside the plasma region 52. The step here is substantially the same as that described relative to FIG. 10(*a*), except that the selection of the gas is different and that the irradiation object is the gold bump 3.

In FIG. 12(*b*), the bonding wire 2 is a narrow gold wire, the microplasma is changed to a reducing one, and the position of the tip of the bonding wire 2 in the interior of the capillary 40 is set inside the plasma region 52; and material that is the same as the bonding wire 2 is deposited on the surface of the cleaned gold bump 3. This step is also substantially the same as that described relative to FIG. 10(*b*), except that the irradiation object is the gold bump 3.

The chip 6 on which the surface removal processing and surface deposition processing for all of the bumps 3 have been finished is inverted and is held in a facedown condition by the collet 26. By facedown condition is meant that the bumps 3 are oriented downward. The holding of the chip 6 by the collet 26 can be performed by vacuum suction. How this is done is shown in FIG. 12(*c*).

Then, surface treatment is performed on the bonding leads 4 on the circuit board, At this point, the gas type is, for example, oxygen, and the oxidizing microplasma 302 used. Depending on the case, the reducing microplasma 301 can be selected. In FIG. 12(*d*), the gas is oxygen, the microplasma is an oxidizing one, the position of the tip of the bonding wire 2 in the interior of the capillary 40 is set outside the plasma region 52, and organic matter are removed from the surface of the bonding leads 4. The step here is substantially the same as that described relative to FIG. 12(*a*), except that the irradiation object is the bonding lead 4.

Furthermore, FIG. 12(*e*) is a step where the microplasma is changed to a reducing one, the position of the tip of the bonding wire 2 in the interior of the capillary 40 is set inside the plasma region 52, and material that is the same as the bonding wire 2 is deposited on the surface of the bonding lead 4. The step here is also substantially the same as that described relative to FIG. 12(*b*), except that the irradiation object is the bonding lead 4.

Then, the chip 6 held face down is positioned relative to this bonding lead 4, and facedown bonding is performed. How this is done is shown in FIG. 12(*f*). The manner of the bumps 3 of the chip 6 connected to the bonding leads 4 is shown in FIG. 12(*g*).

In flip chip technology, when the circuit board is a film board, it is called chip on film (COF). In one technology in such cases, low-temperature solder is provided on the bonding lead, and connection between the bonding lead and the bump 3 is performed by thermo-compression bonding. In this situation, the surface treatment on the bonding lead 4 side can be omitted, and surface treatment may be performed only on the bump 3.

EMBODIMENT 6

As described above, the wire bonding apparatus 200 shown in FIG. 1 is a single-stage single-capillary type, and the wire bonding apparatus 10 shown in FIG. 9 is a dual-stage, dual-capillary type. The single-stage single-capillary type is characterized by the fact that, after surface treatment is finished, bonding processing is performed without waiting very long; while the dual-stage, dual-capillary type is characterized in that surface treatment and bonding processing are performed in parallel on the same type of bonding subject In contrast thereto, it is also possible to take a single-stage, dual-capillary type in a bonding apparatus.

Figure 13:
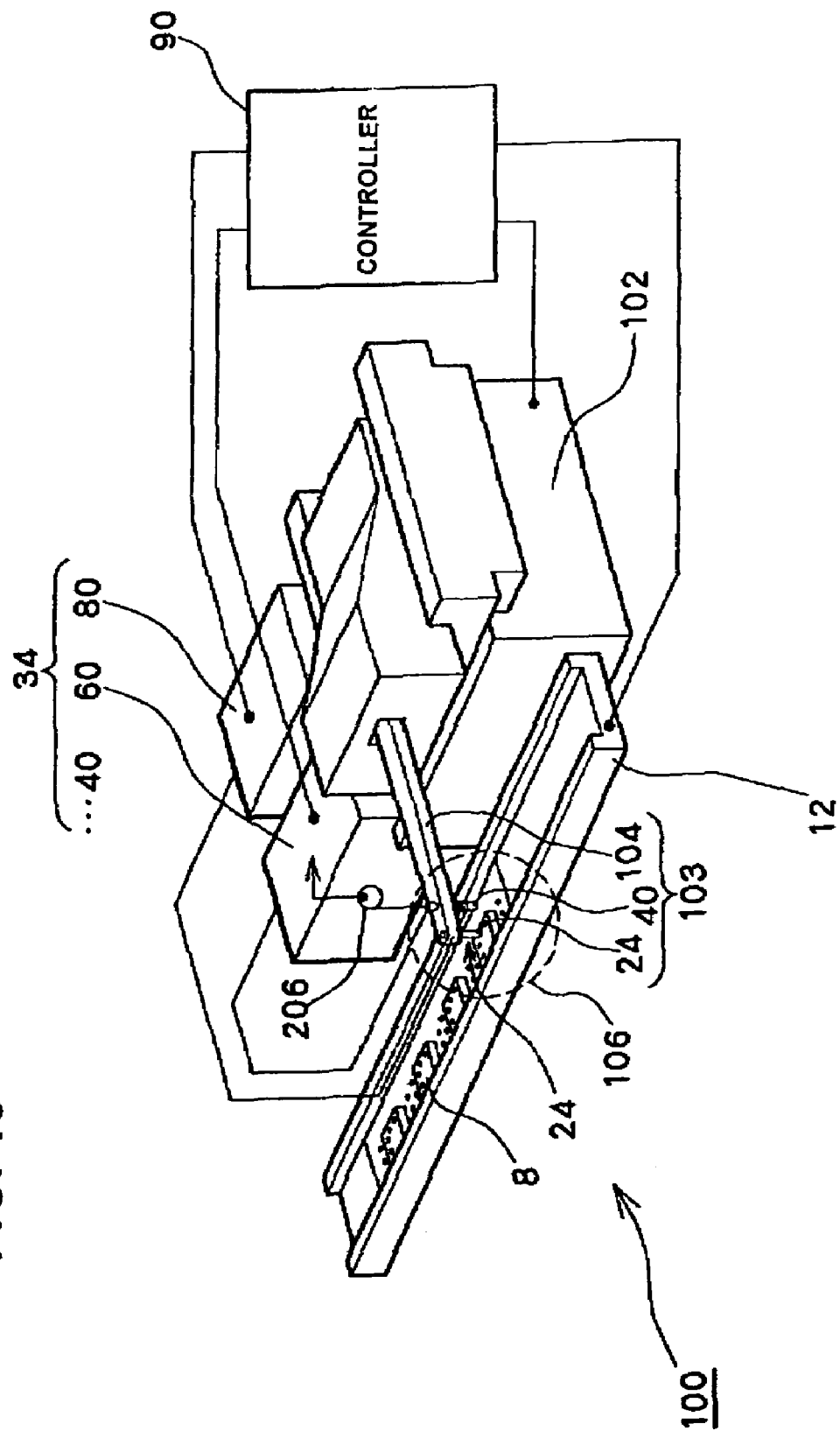
FIG. 13 shows a single-stage, dual-capillary type wire bonding apparatus according to an embodiment of the present invention.

FIG. 13 shows a single-stage, dual-capillary type wire bonding apparatus 100 that includes one XYZ drive mechanism 102, one arm 103, and one process stage 106; and a plasma capillary 40 and a bonding capillary 24 are provided on a single, one arm 103. In the following description, the same reference numerals are applied to elements that are the same as in FIG. 1, and a detailed description thereof will be omitted.

Figure 14:
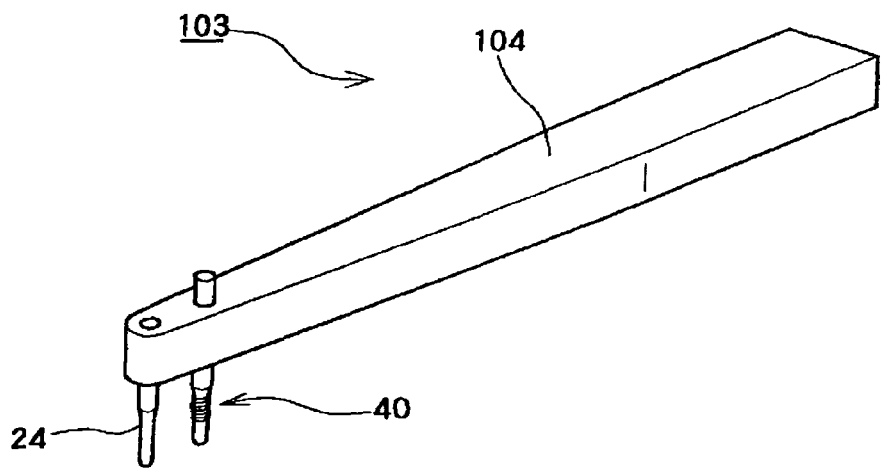
FIG. 14 shows an arm used in a single-stage, dual-capillary type wire bonding apparatus according to an embodiment of the present invention.

In the single-stage, dual-capillary type bonding apparatus 100, both the bonding capillary 24 and the plasma capillary 40 are fitted to the arm 103. FIG. 14 shows the detail of the arm 103. The arm 103 is comprised of an arm main body 104 and the bonding capillary 24 and the plasma capillary 40 that are provided in parallel at the tip end of the arm 103. The particulars of the position changing unit 206 and of the microplasma generator 34 formed by the plasma capillary 40, gas supply unit 60 and high-frequency power supply unit 80 are the same as those described relative to FIG. 3 and FIG. 4.

The procedures for the surface treatment and bonding processing can generally be conducted sequentially and reciprocally in this single-stage, dual-capillary type bonding apparatus 100. For example, for one bonding pad, the plasma capillary 40 is positioned, and surface removal processing and surface deposition processing are performed on the surface of the bonding pad. Then the arm main body 104 is moved, the plasma capillary 40 is positioned at the corresponding bonding lead, and surface removal processing and surface deposition processing are performed on the surface of the bonding lead. When the surface treatment has finished on one set of a bonding pad and bonding lead in this manner, the arm main body 104 is next moved, the position of the bonding capillary 24 is returned to where the bonding pad is, first wire bonding is performed, and, following thereupon, the position of the bonding capillary 24 is moved to where that bonding lead is and second bonding is performed.

In other words, in the procedures shown in FIGS. 10(*a*) through 10(*g*) and described relative to the actions of the dual-stage, dual-capillary type wire bonding apparatus 10, steps of FIGS. 10(*a*) through 10(*g*) are repeated. In these procedures, the surface treatment and bonding processing are performed alternately, in the manner of surface treatment→bonding processing→surface treatment→bonding processing, and this is performed sequentially for each set of bonding pad and bonding lead. With this method, the time interval up to bonding processing for the bonding pad and the bonding lead, after the surface treatment thereon, can be shortened considerably compared to the dual-stage, dual-capillary type wire bonding apparatus 10, although not as much as with the single-stage, single-capillary type wire bonding apparatus 200. As a result bonding can be done while reducing the opportunity for oxidized films or foreign matter or the like to again adhere after the surface treatment.

FIG. 14 shows a structure of an arm 103 in which both the bonding capillary 24 and the plasma capillary 40 are deployed on one arm main body 104 such that they are proximate and in parallel—As seen from FIG. 14, the plasma capillary 40 is provided so that it is inclined relative to the bonding capillary 24, making the point toward which the bonding capillary 24 is oriented and the point toward which the plasma capillary 40 is oriented to be substantially the same. With this structure, the movement mechanism for the arm 103 is made even simpler. In other words, without moving the arm 103, for the same bonding pad and bonding lead, surface treatment can be performed, effecting irradiation with a microplasma from the plasma capillary 40, after which the generation of the microplasma can be stopped, and the wire bonded using the bonding capillary 24.

In the structure of FIG. 14, both the bonding capillary 24 and the plasma capillary 40 are provided on one arm main body 104. As a result, when the arm main body 104 also serves as a horn for efficiently transmitting ultrasonic energy to the tip end thereof, it is possible that the efficiency of that energy transmission will not always be ideal, due to the existence of the plasma capillary 40. Accordingly, a wire bonding apparatus in which the structure of FIG. 14 is used is suitable for a system in which ultrasonic energy is not employed as in the case of, for instance, a thermo-compression bonding system. Application is also possible in apparatuses in which thermo-compression bonding is aided by ultrasonic energy.

Figure 15:
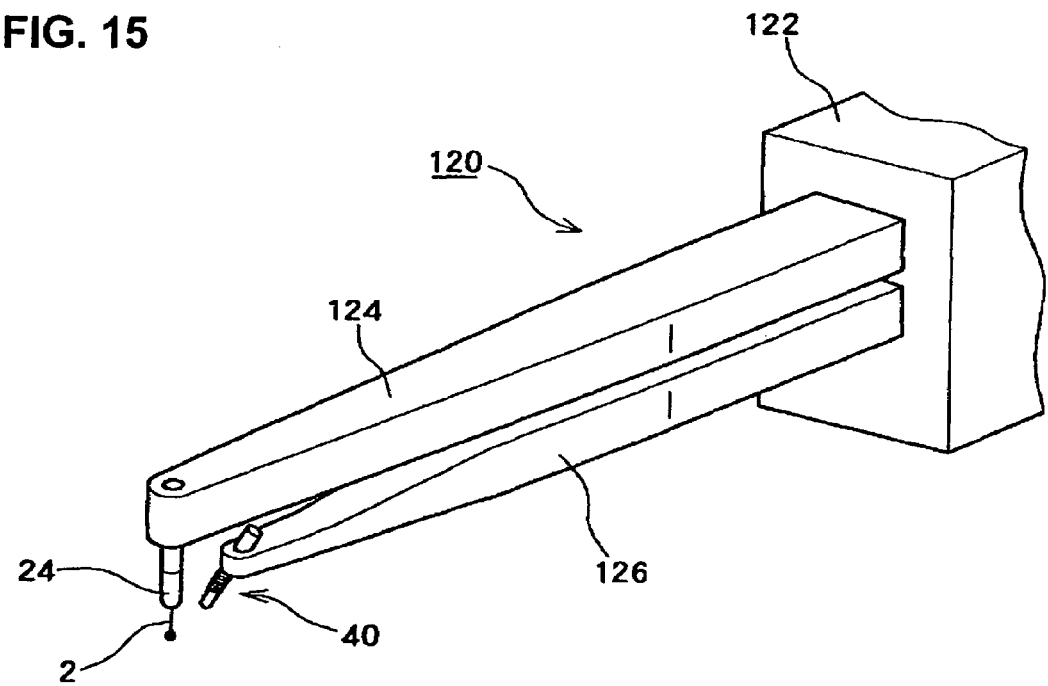
FIG. 15 shows another arm used in a single-stage, dual-capillary type wire bonding apparatus according to an embodiment of the present invention.

FIG. 15 shows an example of another arm configuration in a single-stage, dual-capillary type wire bonding apparatus. The arm 120 of this apparatus is comprised of two arm main bodies, namely a bonding arm main body 124 for the bonding capillary 24, and a plasma arm main body 126 for the plasma capillary 40, that are provided separately on a common base unit 122 so as not to interfere with each other. The base unit 122 is fitted to a common XYZ drive mechanism.

According to the structure of FIG. 15, even in a bonding apparatus of a type in which bonding processing is performed mainly with ultrasonic energy, the shape of the bonding arm main body 124 can be set optimally, eliminating the effects of the plasma capillary 40.

In the structure of FIG. 15, the plasma capillary 40 is provided so as to be inclined relative to the bonding capillary 24, and the point toward which the bonding capillary 24 is oriented and the point toward which the plasma capillary 40 is oriented are made substantially the same. With this structure, as described above, the movement drive for the arm 120 can be made even simpler. The bonding capillary 24 and plasma capillary 40 can of course be deployed in parallel.

The invention may be embodied in other specific forms without departing from the sprit or essential characteristics thereof. The present embodiment is therefore to be considered in all respects as illustrative and not restrictive, the scope of the invention being indicated by the appended claims rather than by the foregoing description and all changes which come within the meaning and range of equivalency of the claims are therefore intended to be embraced therein.

The invention claimed is:

1. A bonding apparatus comprising:
 a bonding processor for executing a bonding process on a bonding subject using a bonding tool;
 a plasma capillary having a high-frequency coil wound on a tip end portion thereof;
 an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject;
 a position changing unit for changing positions a tip of a thin wire being made of a prescribed material inserted the interior of the plasma capillary between a surface removal position being outside of a plasma region and a surface deposition position being inside of the plasma region in the interior of the plasma capillary; and
 a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit.

2. A bonding apparatus comprising:
 a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof;
 a gas supply unit for supplying gas comprising a surface treatment gas and a carrier gas to an interior of the capillary, the gas supply unit including a switch box for switching the surface treatment gases, and a mixing box for mixing the surface treatment gas and the carrier gas;
 a position changing unit for changing positions of a tip position of the bonding wire; and
 a controller for controlling a wire bonding processing.

3. A bonding apparatus comprising:
 a bonding processor for executing a bonding process on a bonding subject using a bonding arm having a bonding capillary;
 a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject;
 a plasma processor for performing the surface treatment on the bonding subject using a plasma arm having the plasma capillary at a tip end thereof;
 a position changing unit for changing positions a tip of a thin wire being made of a prescribed material inserted the interior of the plasma capillary between a surface removal position being outside of a plasma region and a surface deposition position being inside of the plasma region in the interior of the plasma capillary; and a controller for interconnectedly controlling actions of the bonding arm and actions of the plasma arm.

4. The bonding apparatus according to claim 3, wherein:
the bonding processor performs the bonding processing on a bonding subject held in a bonding stage;
the plasma processor performs a surface treatment on a bonding subject which is of the same type as a bonding subject processed by the bonding processor and which is held in a surface treatment stage; and
the controller effects control causing the bonding processing and the surface treatment to be interconnectedly performed, respectively, at the same sites in bonding subjects of the same type.

5. The bonding apparatus according to claim 3, wherein:
the controller effects control for interconnectedly executing the bonding process and the surface treatment on the same bonding subject.

6. The bonding apparatus according to claim 5, wherein:
the controller effects control for causing the bonding arm and the plasma arm to move as a unit.

7. A bonding method using a bonding apparatus, comprising:
providing a bonding apparatus, the bonding apparatus comprising:
a bonding processor for executing a bonding process on a bonding subject using a bonding tool,
a plasma capillary having a high-frequency coil wound on a tip end portion thereof,
an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject,
a position changing unit for changing positions of a tip position of thin wire being made of a prescribed material inserted the interior of the plasma capillary between a surface removal position being outside of a plasma region and a surface deposition position being inside of the plasma region in the interior of the plasma capillary, and
a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit;
changing positions of the tip of the thin wire inserted the interior of the plasma capillary between
a surface removal position where the tip of the thin wire being positioned outside the plasma region, and
a surface deposition position where the tip of the thin wire being positioned inside the plasma region;
depositing the prescribed material on the bonding subject to move positions of the tip of the thin wire to the surface deposition position in the interior of the plasma capillary by controlling the position changing unit after removing foreign matter or contaminants of a surface on the bonding subject to move positions of the tip of the thin wire to the surface removal position in the interior of the plasma capillary by controlling the position changing unit; then
executing the bonding process onto a site depositing the prescribed material by the bonding processor.

8. A bonding method using a bonding apparatus, comprising:
providing a bonding apparatus, the bonding apparatus comprising:
a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof,
a gas supply unit for supplying gas to an interior of the capillary,
a position changing unit for changing positions of a tip position of the bonding wire, and
a controller for controlling a wire bonding processing; changing positions of the tip position of the bonding wire inserted into the capillary among
a bonding process position for effecting wire bonding,
a surface removal position where the tip of the bonding wire being positioned outside the plasma region, and
a surface deposition position where the tip of the bonding wire being positioned inside the plasma region;
depositing the material of the bonding wire on the bonding subject to move positions of the tip of the bonding wire to the surface deposition position in the interior of the capillary by controlling the position changing unit after removing foreign matter or contaminants of a surface on the bonding subject to move positions of the tip of the bonding wire to the surface removal position in the interior of the capillary by controlling the position changing unit; then
executing the bonding process onto a site depositing the material of the bonding wire.

9. A bonding method using a bonding apparatus, comprising:
providing a bonding apparatus, the bonding apparatus comprising:
a bonding processor for executing a bonding process on a bonding subject using a bonding arm having a bonding capillary,
a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject,
a plasma processor for performing the surface treatment on the bonding subject using a plasma arm having the plasma capillary at a tip end thereof,
a position changing unit for changing positions a tip of a thin wire being made of a prescribed material inserted the interior of the plasma capillary between a surface removal position being outside of a plasma region and a surface deposition position being inside of the plasma region in the interior of the plasma capillary, and
a controller for interconnectedly controlling actions of the bonding arm and actions of the plasma arm;

changing positions of the tip of the thin wire inserted the interior of the plasma capillary between
   a surface removal position where the tip of the thin wire being positioned outside the plasma region, and
   a surface deposition position where the tip of the thin wire being positioned inside the plasma region; and
depositing the prescribed material on the bonding subject to move positions of the tip of the thin wire to the surface deposition position in the interior of the plasma capillary by controlling the position changing unit after removing foreign matter or contaminants of a surface on the bonding subject to move positions of the tip of the thin wire to the surface removal position in the interior of the plasma capillary by controlling the position changing unit; then
executing the bonding process onto a site depositing the prescribed material by the bonding processor.

10. A bonding method comprising the step of:
providing a bonding processor for executing a bonding process on a bonding subject using a bonding tool;
providing a plasma capillary having a high-frequency coil wound on a tip end portion thereof;
providing an inductively coupled microplasma generator including the plasma capillary and for performing a surface treatment on the bonding subject by ejecting gas being a plasma in an interior of the plasma capillary by supply of electric power to the high-frequency coil of the plasma capillary, from an opening at a tip end portion of the plasma capillary onto the bonding subject;
providing a position changing unit for changing positions of a tip of a thin wire being made of a prescribed material inserted the interior of the plasma capillary between a surface removal position being outside of a plasma region and a surface deposition position being inside of the plasma region in the interior of the plasma capillary;
providing a controller for depositing the prescribed material on the bonding subject to move positions of the tip of the thin wire to the surface deposition position in the inductively coupled microplasma generator by controlling the position changing unit after removing foreign matter or contaminants of a surface on the bonding subject to move positions of the tip of the thin wire to the surface removal position in the inductively coupled microplasma generator by controlling the position changing unit;
changing positions of the tip of the thin wire inserted the interior of the plasma capillary between
   a surface removal position where the tip of the thin wire being positioned outside the plasma region, and
   a surface deposition position where the tip of the thin wire being positioned inside the plasma region;
depositing the prescribed material on the bonding subject to move positions of the tip of the thin wire to the surface deposition position in tile interior of the plasma capillary by controlling the position changing unit after removing foreign matter or contaminants of a surface on the bonding subject to move positions of the tip of the thin wire to the surface removal position in the interior of the plasma capillary by controlling the position changing unit; than
executing the bonding process onto a site depositing the prescribed material by the bonding processor.

11. A bonding method comprising the step of:
providing a capillary being tubular and made of an insulating material, the capillary being provided with a high-frequency coil wound on an outer circumference of a tip end portion of the capillary and being supplied of high-frequency electric power thereto, and the capillary allowing a bonding wire to insert into an interior thereof;
providing a gas supply unit for supplying gas to an interior of the capillary;
providing a position changing unit for changing positions of a tip position of the bonding wire;
providing a controller for controlling a wire bonding processing;
changing positions of the tip position of the bonding wire inserted into the capillary among
   a bonding process position for effecting wire bonding,
   a surface removal position where the tip of the bonding wire being positioned outside the plasma region, and
   a surface deposition position where the tip of the bonding wire being positioned inside the plasma region;
depositing the material of the bonding wire on the bonding subject to wove positions of the tip of the bonding wire to the surface deposition position in the interior of the capillary by controlling the position changing unit after removing foreign matter or contaminants of a surface on the bonding subject to move positions of the tip of the bonding wire to the surface removal position in the interior of the capillary by controlling the position changing unit; then
executing the bonding process onto a site depositing the material of the bonding wire.

12. A bonding method comprising the step of:
providing a bonding processor for executing a bonding process on a bonding subject using a bonding arm having a bonding capillary;
providing a plasma capillary for performing a surface treatment on the bonding subject and having a high-frequency coil wound on a tip end portion thereof, the plasma capillary ejecting gas being a plasma in an interior thereof by supply of electric power to the high-frequency coil thereof, from an opening at a tip end portion thereof onto the bonding subject;
providing a plasma processor for performing the surface treatment on the bonding subject using a plasma arm having the plasma capillary at a tip end thereof,
providing a position changing unit for changing positions a tip of a thin wire being made of a prescribed material inserted the interior of the plasma capillary between a surface removal position being outside of a plasma region and a surface deposition position being inside of the plasma region in the interior of the plasma capillary;
providing a controller for interconnectedly controlling actions of the bonding arm and actions of the plasma arm;
changing positions of the tip of the thin wire inserted the interior of the plasma capillary between
   a surface removal position where the tip of the thin wire being positioned outside the plasma region, and
   a surface deposition position where the tip of the thin wire being positioned inside the plasma region;
depositing the prescribed material on the bonding subject to move positions of the tip of the thin wire to the surface deposition position in the interior of the plasma capillary by controlling the position changing unit after removing foreign matter or contaminants of a surface on the banding subject to move positions of the tip of the thin wire to the surface removal position in the interior of the plasma capillary by controlling the position changing unit; then
executing the bonding process onto a site depositing the prescribed material by the bonding processor.

\* \* \* \* \*